United States Patent
Chen et al.

(10) Patent No.: US 12,218,022 B2
(45) Date of Patent: *Feb. 4, 2025

(54) PASSIVATION STRUCTURE WITH PLANAR TOP SURFACES

(71) Applicant: Taiwan Semiconductor Manufacturing Co., Ltd., Hsinchu (TW)

(72) Inventors: Yi-Hsiu Chen, Hsinchu (TW); Wen-Chih Chiou, Zhunan Township (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/355,799

(22) Filed: Jul. 20, 2023

(65) Prior Publication Data

US 2023/0360992 A1    Nov. 9, 2023

Related U.S. Application Data

(63) Continuation of application No. 17/324,836, filed on May 19, 2021, now Pat. No. 11,817,361.

(Continued)

(51) Int. Cl.
*H01L 23/48* (2006.01)
*H01L 21/56* (2006.01)
(Continued)

(52) U.S. Cl.
CPC .......... *H01L 23/3171* (2013.01); *H01L 21/56* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/03* (2013.01); *H01L 24/05* (2013.01); *H01L 24/11* (2013.01); *H01L 24/13* (2013.01);
(Continued)

(58) Field of Classification Search
CPC ......... H01L 24/24; H01L 2224/03916–73204; H01L 25/0657
See application file for complete search history.

(56) References Cited

U.S. PATENT DOCUMENTS 6,153,517 A    11/2000    Chuang et al.
7,470,988 B2   12/2008    Lin et al.
(Continued)

FOREIGN PATENT DOCUMENTS

DE    102016110270 A1    1/2017
DE    102020125330 A1    5/2021
(Continued)

*Primary Examiner* — Hoa B Trinh
(74) *Attorney, Agent, or Firm* — Slater Matsil, LLP

(57) ABSTRACT

A method includes forming a first passivation layer, forming a metal pad over the first passivation layer, forming a planarization layer having a planar top surface over the metal pad, and patterning the planarization layer to form a first opening. A top surface of the metal pad is revealed through the first opening. The method further includes forming a polymer layer extending into the first opening, and patterning the polymer layer to form a second opening. The top surface of the metal pad is revealed through the second opening.

20 Claims, 44 Drawing Sheets

Related U.S. Application Data

(60) Provisional application No. 63/148,647, filed on Feb. 12, 2021.

(51) Int. Cl.
*H01L 23/00* (2006.01)
*H01L 23/31* (2006.01)
*H01L 23/498* (2006.01)
*H01L 23/538* (2006.01)
*H01L 25/065* (2023.01)

(52) U.S. Cl.
CPC .............. *H01L 24/16* (2013.01); *H01L 24/19* (2013.01); *H01L 24/20* (2013.01); *H01L 24/24* (2013.01); *H01L 24/73* (2013.01); *H01L 25/0652* (2013.01); H01L 2224/03916 (2013.01); H01L 2224/05017 (2013.01); H01L 2224/1191 (2013.01); H01L 2224/13022 (2013.01); H01L 2224/13026 (2013.01); H01L 2224/16147 (2013.01); H01L 2224/16235 (2013.01); H01L 2224/211 (2013.01); H01L 2224/24145 (2013.01); H01L 2224/24225 (2013.01); H01L 2224/73204 (2013.01); H01L 2225/06513 (2013.01); H01L 2225/06517 (2013.01); H01L 2225/0652 (2013.01); H01L 2225/06541 (2013.01); H01L 2225/06548 (2013.01)

(56) References Cited

U.S. PATENT DOCUMENTS

| | | | |
|---|---|---|---|
| 10,446,522 | B2 | 10/2019 | Lin et al. |
| 10,962,711 | B2 | 3/2021 | Chang et al. |
| 11,817,361 | B2 * | 11/2023 | Chen ........................ H01L 21/56 |
| 2006/0063371 | A1 * | 3/2006 | Lin ........................ H01L 23/522 |
| | | | 257/E23.152 |
| 2011/0186987 | A1 | 8/2011 | Wang et al. |
| 2017/0221789 | A1 | 8/2017 | Chen |
| 2017/0309588 | A1 | 10/2017 | Wu et al. |
| 2024/0194723 | A1 * | 6/2024 | Tandon ................. H01L 33/502 |

FOREIGN PATENT DOCUMENTS

| | | |
|---|---|---|
| TW | 201639103 A | 11/2016 |
| TW | 202021084 A | 6/2020 |

* cited by examiner

PASSIVATION STRUCTURE WITH PLANAR TOP SURFACES

PRIORITY CLAIM AND CROSS-REFERENCE

This application is a continuation of U.S. patent application Ser. No. 17/324,836 entitled "Passivation Structure with Planar Top Surfaces" filed May 19, 2021, which claims the benefit of the following provisionally filed U.S. Patent application: Application No. 63/148,647, filed on Feb. 12, 2021, and entitled "Semiconductor Structure and Manufacturing Method Thereof," which applications are hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a polymer layer are formed over the metal pad, with the metal pad exposed through the openings in the passivation layer and the polymer layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
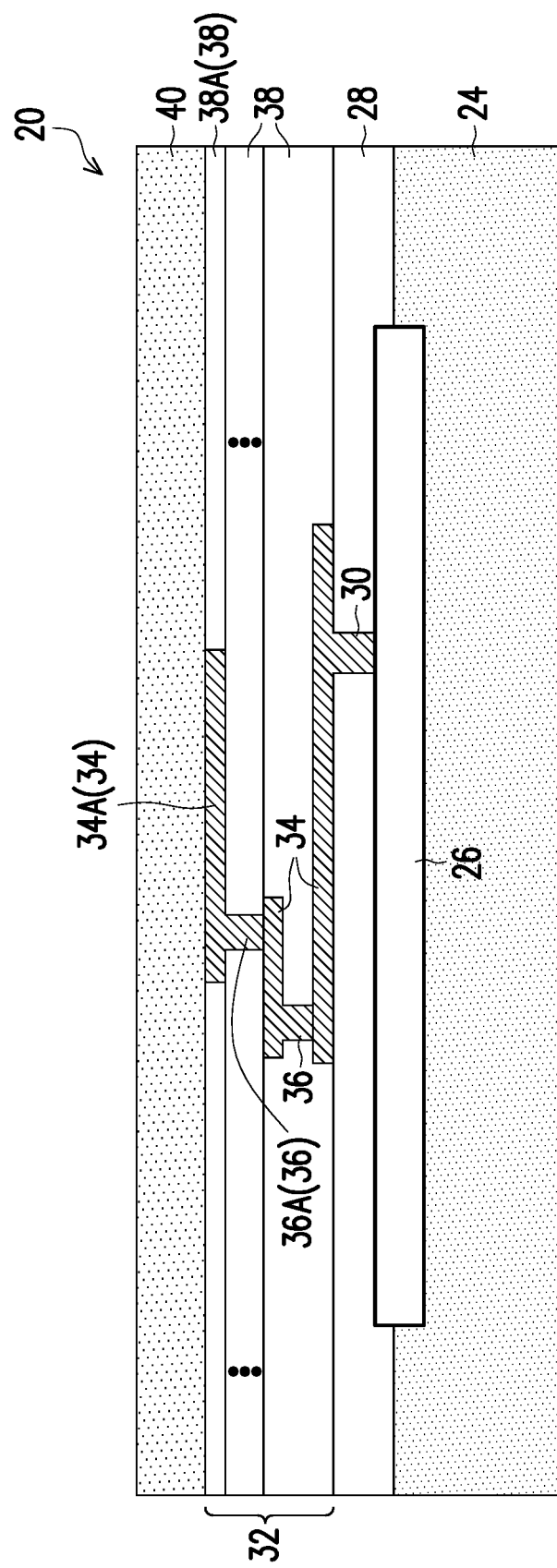
FIGS. 1-12, 13A, 13B, and 14 illustrate the cross-sectional views of intermediate stages in the formation of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package component including a passivation structure, a bonding structure, and the method of forming the same are provided in accordance with some embodiments. The package component includes a metal pad, a passivation layer on the metal pad, and a polymer layer on the passivation layer. A planar top surface is formed before the polymer layer is formed thereon, so that that top surface of the polymer layer is more planar. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-12, 13A, 13B, and 14 illustrate the cross-sectional views of intermediate stages in the formation of a package component including a passivation structure and a bonding structure in accordance with some embodiments of the present disclosure. The corresponding processes are also reflected schematically in the process flow shown in FIG. 43.

FIG. 1 illustrates a cross-sectional view of integrated circuit device 20. In accordance with some embodiments of the present disclosure, device 20 may be or may comprise a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is an interposer wafer, which is free from active devices, and may or may not include passive devices. In accordance with yet alternative embodiments of the present disclosure, device 20 is or comprises a package substrate strip, which includes a core-less package substrate or a cored package substrate with a core therein. In subsequent discussion, a device wafer is used as an example of device 20, and device 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or may comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon nitride, silicon oxynitride ($SiO_xN_y$), low-k dielectric materials, or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a top dielectric layer. The top dielectric layer 38A and the underlying dielectric layer 38 that is immediately underlying the top dielectric layer 38A may be formed as a single continuous dielectric layer, or may be formed as different dielectric layers using different processes, and/or formed of materials different from each other.

Figure 43:
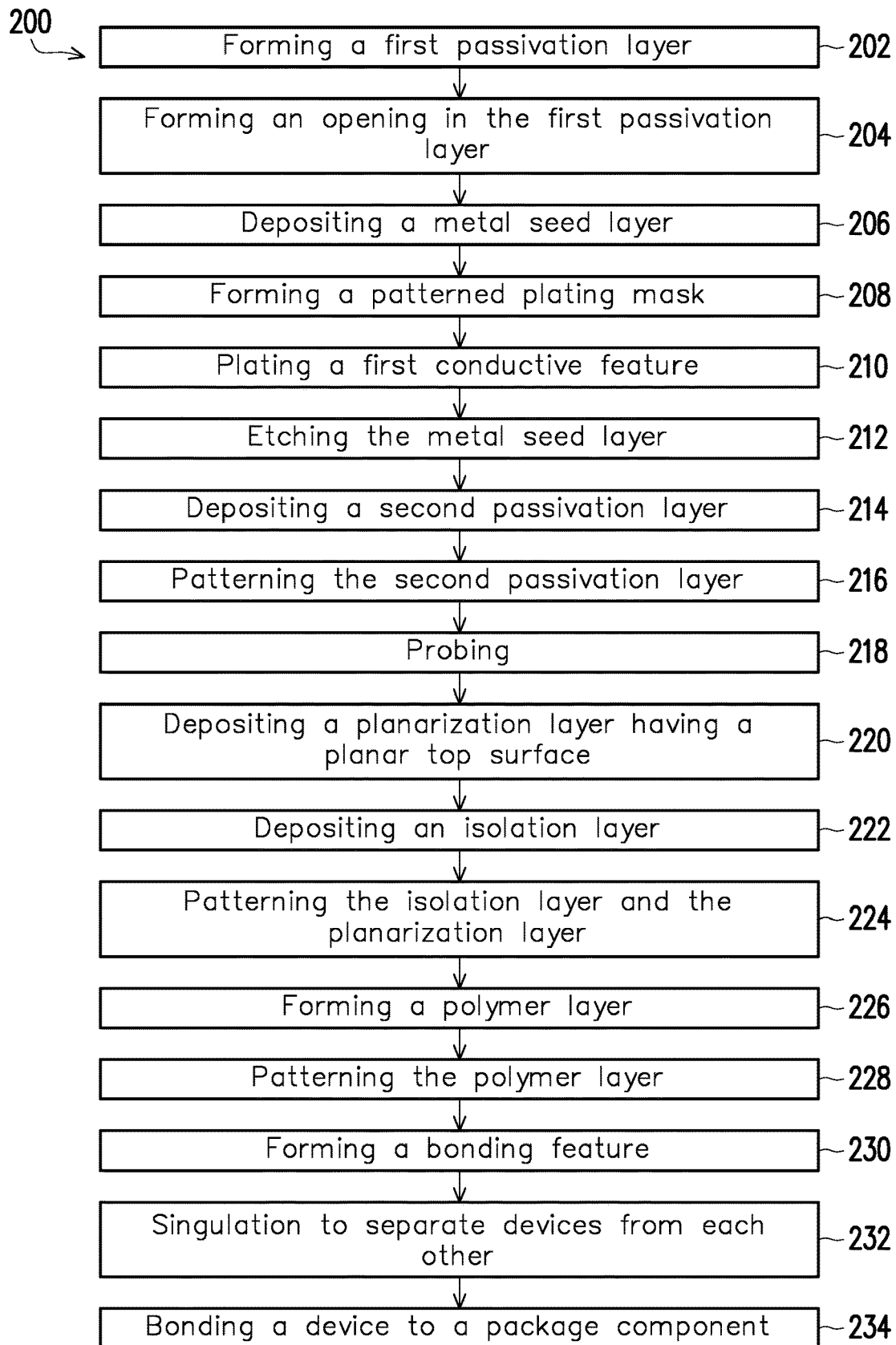
FIG. 43 illustrates a process flow for forming a package component in accordance with some embodiments.

Passivation layer 40 (sometimes referred to as passivation-i or pass-i) is formed over interconnect structure 32. The respective process is illustrated as process 202 in the process flow 200 as shown in FIG. 43. In accordance with some embodiments, passivation layer 40 is formed of a non-low-k dielectric material having a dielectric constant equal to or greater than the dielectric constant of silicon oxide. Passivation layer 40 may be formed of or comprise an inorganic dielectric material, which may include a material selected from, and is not limited to, silicon nitride ($SiN_x$), silicon oxide (SiO$_2$), silicon oxy-nitride (SiON$_x$), silicon oxy-carbide (SiOC$_x$), silicon carbo-nitride (SiCN), or the like, combinations thereof, and/or multi-layers thereof. The value "x" represents the relative atomic ratio. In accordance with some embodiments, passivation layer 40 includes a lower sub layer formed of or comprising SiN or SiCN, with a thickness in the range between about 200 Å and about 2,000 Å, and an upper layer formed of or comprising SiO$_2$, with a thickness in the range between about 2,000 Å and about 20,000 Å. In accordance with some embodiments, the top surfaces of top dielectric layer 38A and metal lines 34A are coplanar. Accordingly, passivation layer 40 may be a planar layer. In accordance with alternative embodiments, the top conductive features protrude higher than the top surface of the top dielectric layer 38A, and passivation layer 40 is non-planar.

Figure 2:
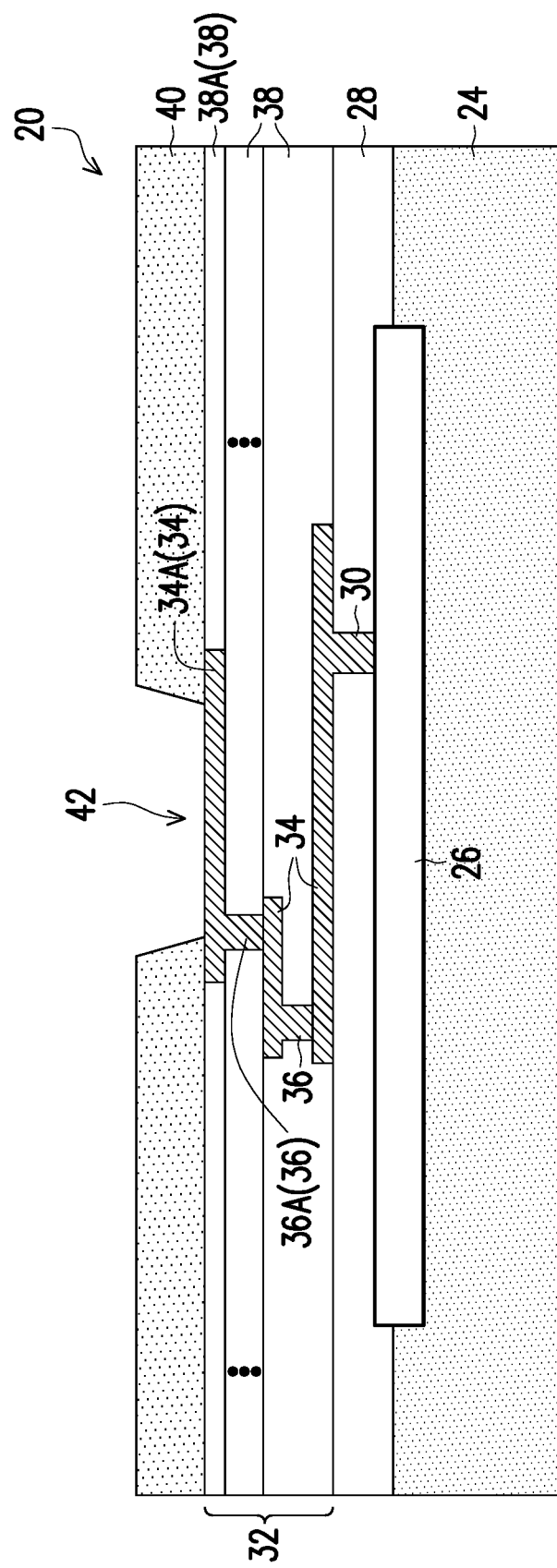

Referring to FIG. 2, passivation layer 40 is patterned in an etching process to form openings 42. The respective process is illustrated as process 204 in the process flow 200 as shown in FIG. 43. The etching process may include a dry etching process, which includes forming a patterned etching mask (not shown) such as a patterned photo resist, and then etching passivation layer 40. The patterned etching mask is then removed. Metal line/pad 34A is exposed through openings 42.

Figure 3:
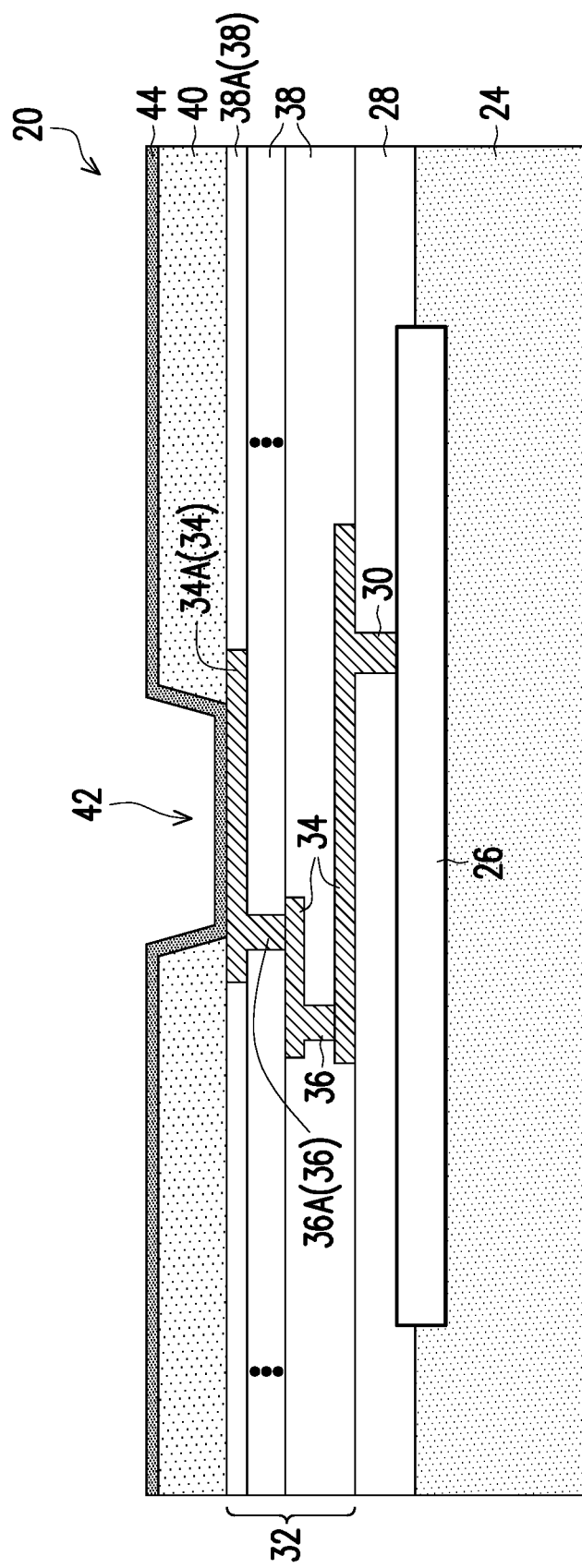

FIG. 3 illustrates the deposition of metal seed layer 44. The respective process is illustrated as process 206 in the process flow 200 as shown in FIG. 43. In accordance with some embodiments, metal seed layer 44 comprises a titanium layer and a copper layer over the titanium layer. In accordance with alternative embodiments, metal seed layer 44 comprises a copper layer in contact with passivation layer 40. The deposition process may be performed using Physical Vapor Deposition (PVD), Chemical Vapor Deposition (CVD), Metal Organic Chemical Vapor Deposition (MOCVD), or the like.

Figure 4:
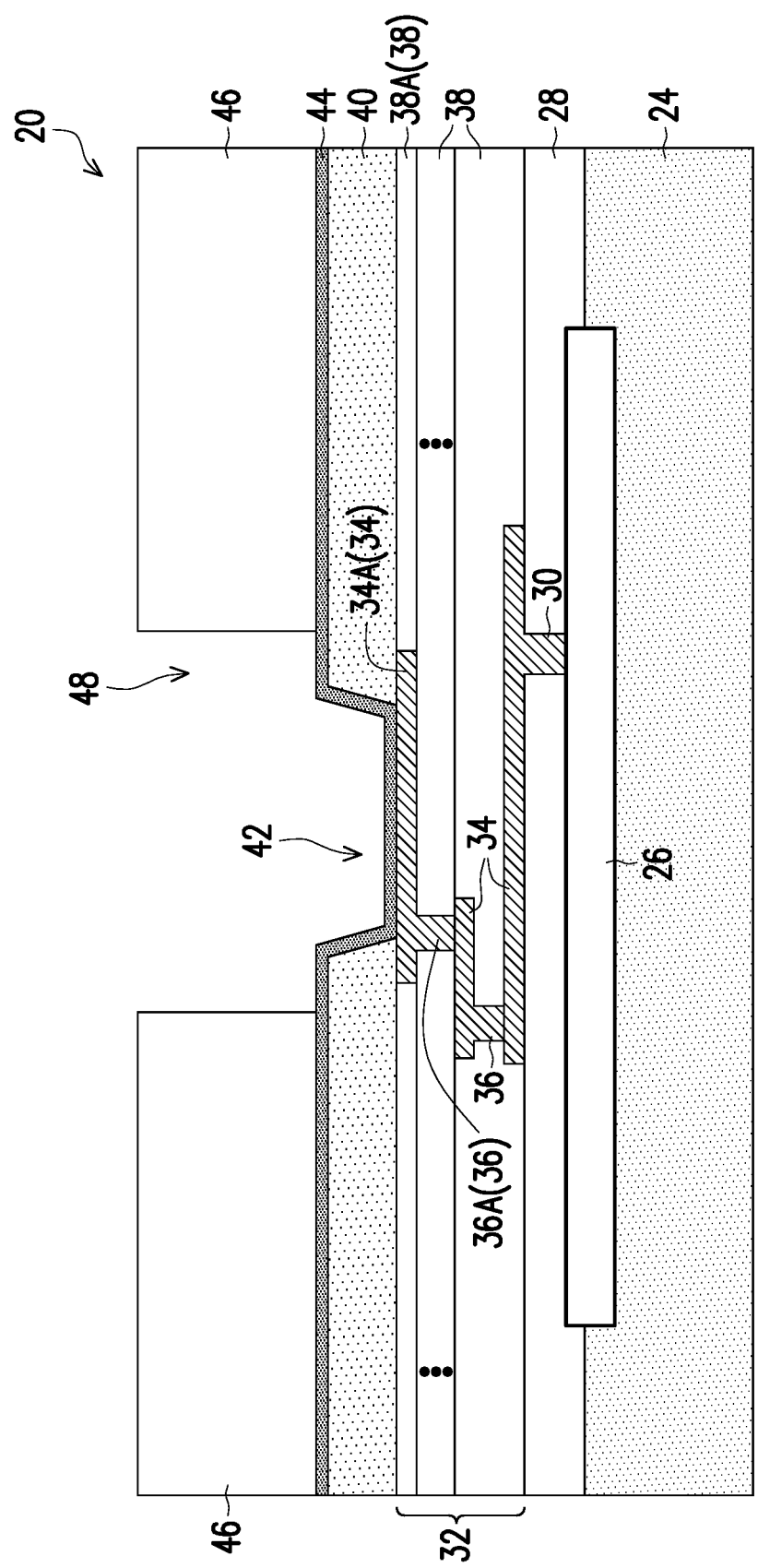

FIG. 4 illustrates the formation of patterned plating mask 46. The respective process is illustrated as process 208 in the process flow 200 as shown in FIG. 43. In accordance with some embodiments, plating mask 46 is formed of a photo resist, and hence is alternatively referred to as photo resist 46. Opening 48 is formed in the patterned plating mask 46 to reveal metal seed layer 44.

Figure 5:
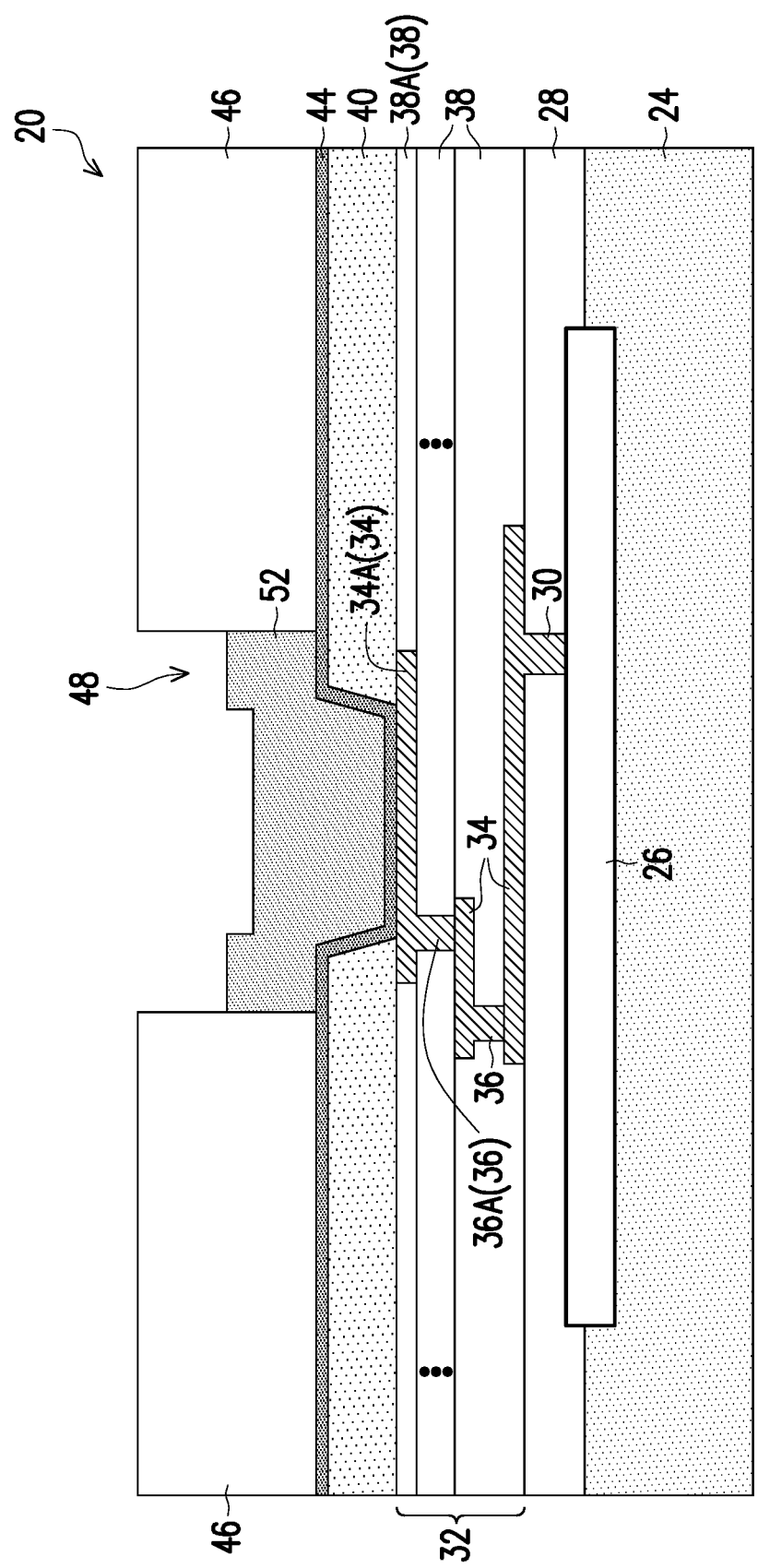

FIG. 5 illustrates the plating of conductive material (features) 52 into opening 48 and on metal seed layer 44. The respective process is illustrated as process 210 in the process flow 200 as shown in FIG. 43. In accordance with some embodiments of the present disclosure, the formation of conductive feature 52 includes a plating process, which may include an electrochemical plating process, an electroless plating process, or the like. Conductive feature 52 may include aluminum copper, copper, aluminum, nickel, tungsten, or the like, or alloys thereof. In accordance with some embodiments, conductive feature 52 comprises copper, and is free from aluminum.

Figure 6:
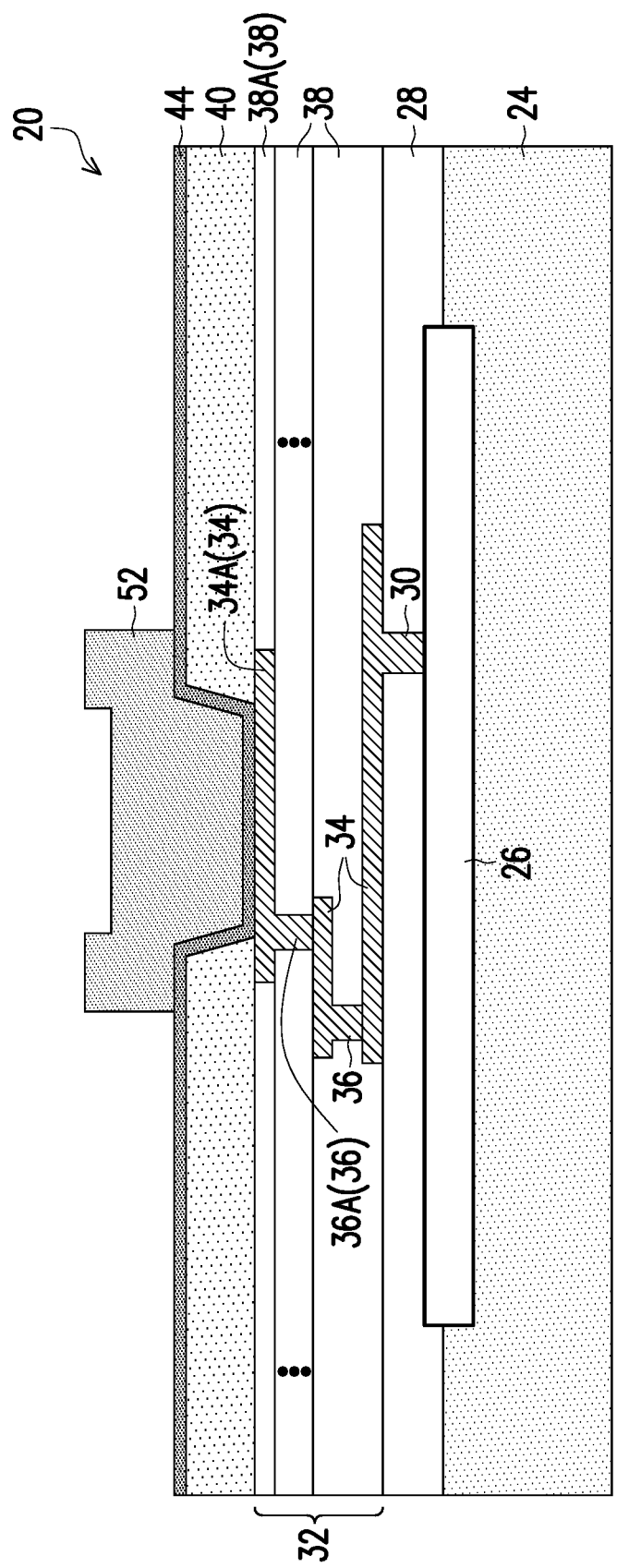
Figure 7:
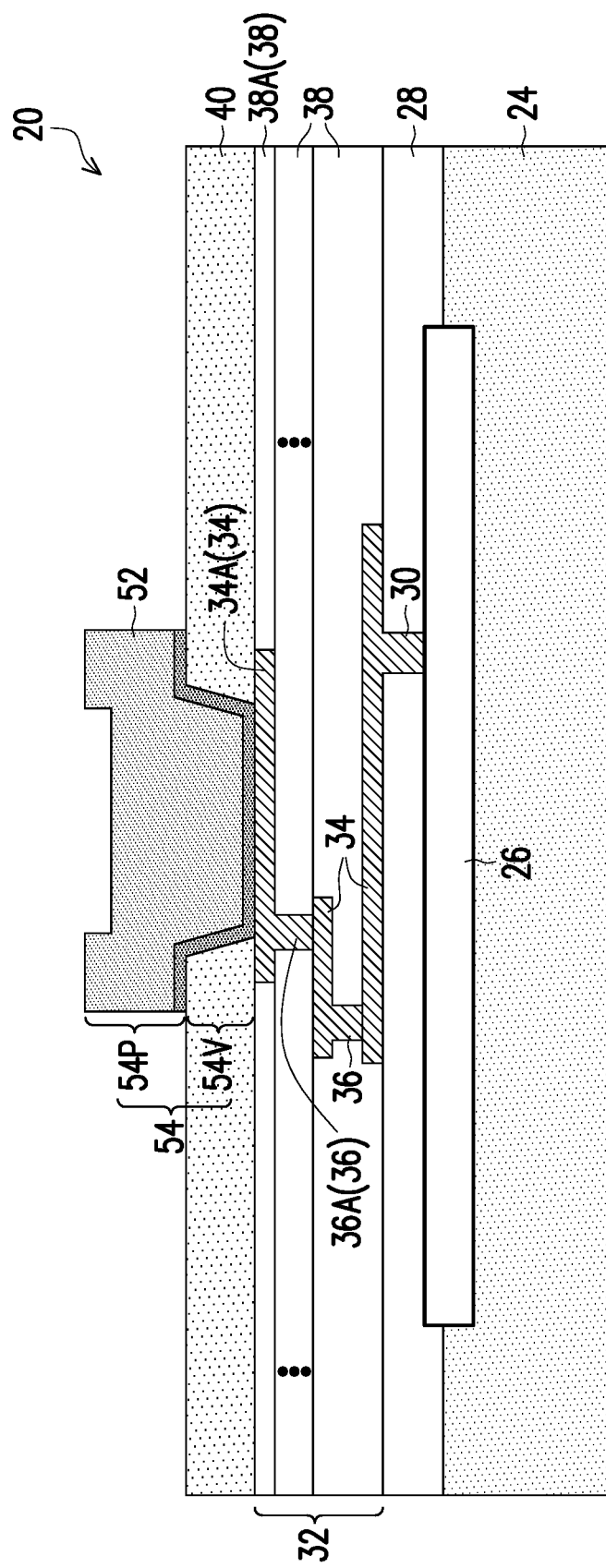

Next, photo resist (plating mask) 46 as shown in FIG. 5 is removed, and the resulting structure is shown in FIG. 6. In a subsequent process, an etching process is performed to remove the portions of metal seed layer 44 that are not protected by the overlying conductive feature 52. The respective process is illustrated as process 212 in the process flow 200 as shown in FIG. 43. The resulting structure is shown in FIG. 7. Throughout the description, conductive feature 52 and the corresponding underlying metal seed layers 44 are collectively referred to Redistribution Line (RDL) 54. RDL 54 may include via 54V extending into passivation layer 40, and metal pad 54P over passivation layer 40.

Figure 8:
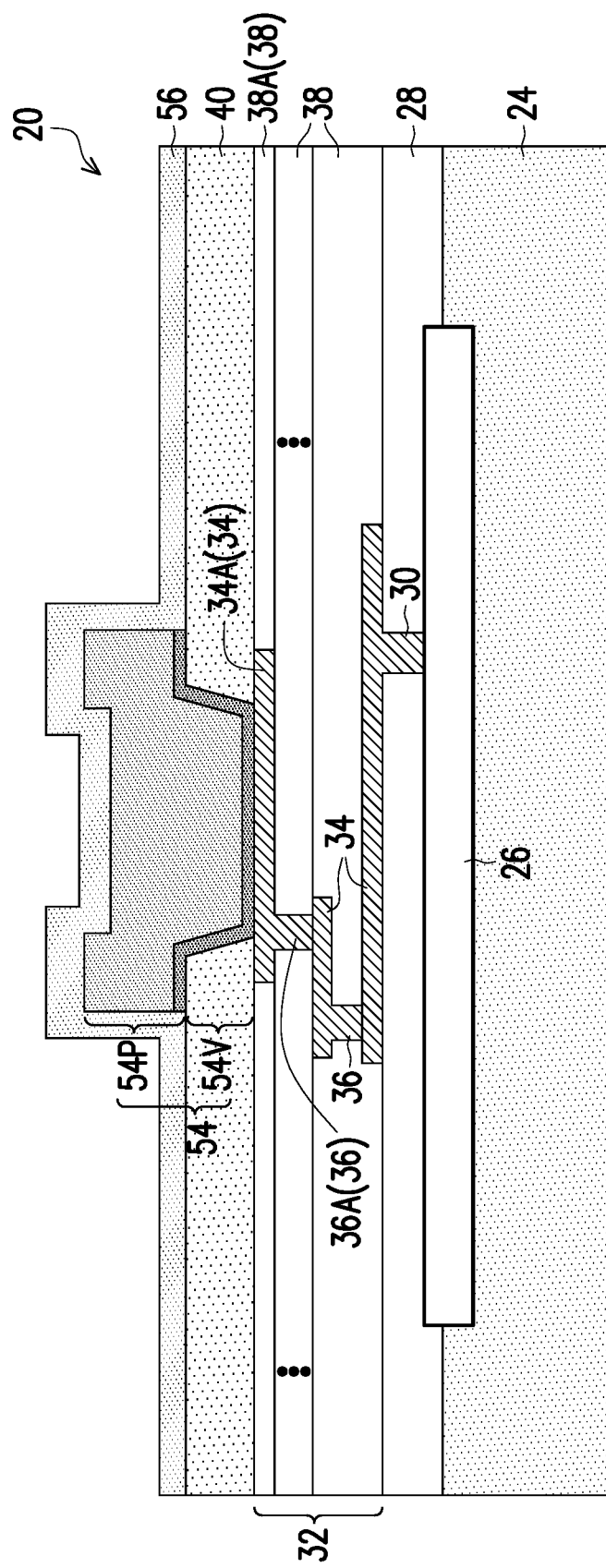

Referring to FIG. 8, passivation layer 56 is deposited. The respective process is illustrated as process 214 in the process flow 200 as shown in FIG. 43. Passivation layer 56 (sometimes referred to as passivation-2 or pass-2) is formed as a blanket layer. In accordance with some embodiments, passivation layer 56 is formed of or comprises an inorganic dielectric material, which may include, and is not limited to, silicon nitride, silicon oxide, silicon oxy-nitride, silicon oxy-carbide, or the like, combinations thereof, or multi-layers thereof. In accordance with some embodiments, passivation layer 56 includes a lower sub layer formed of or comprising SiO$_2$, with a thickness in the range between about 0 Å (thus the lower sub layer is not formed) and about 20,000 Å, and an upper layer formed of or comprising SiN, SiCN, SiON, or the like, with a thickness in the range between about 2,000 Å and about 15,000 Å. The deposition may be performed through a conformal deposition process such as ALD, CVD, or the like. Accordingly, the vertical portions and horizontal portions of passivation layer 56 have the same thickness or substantially the same thickness, for example, with a variation smaller than about 10 percent.

Figure 9:
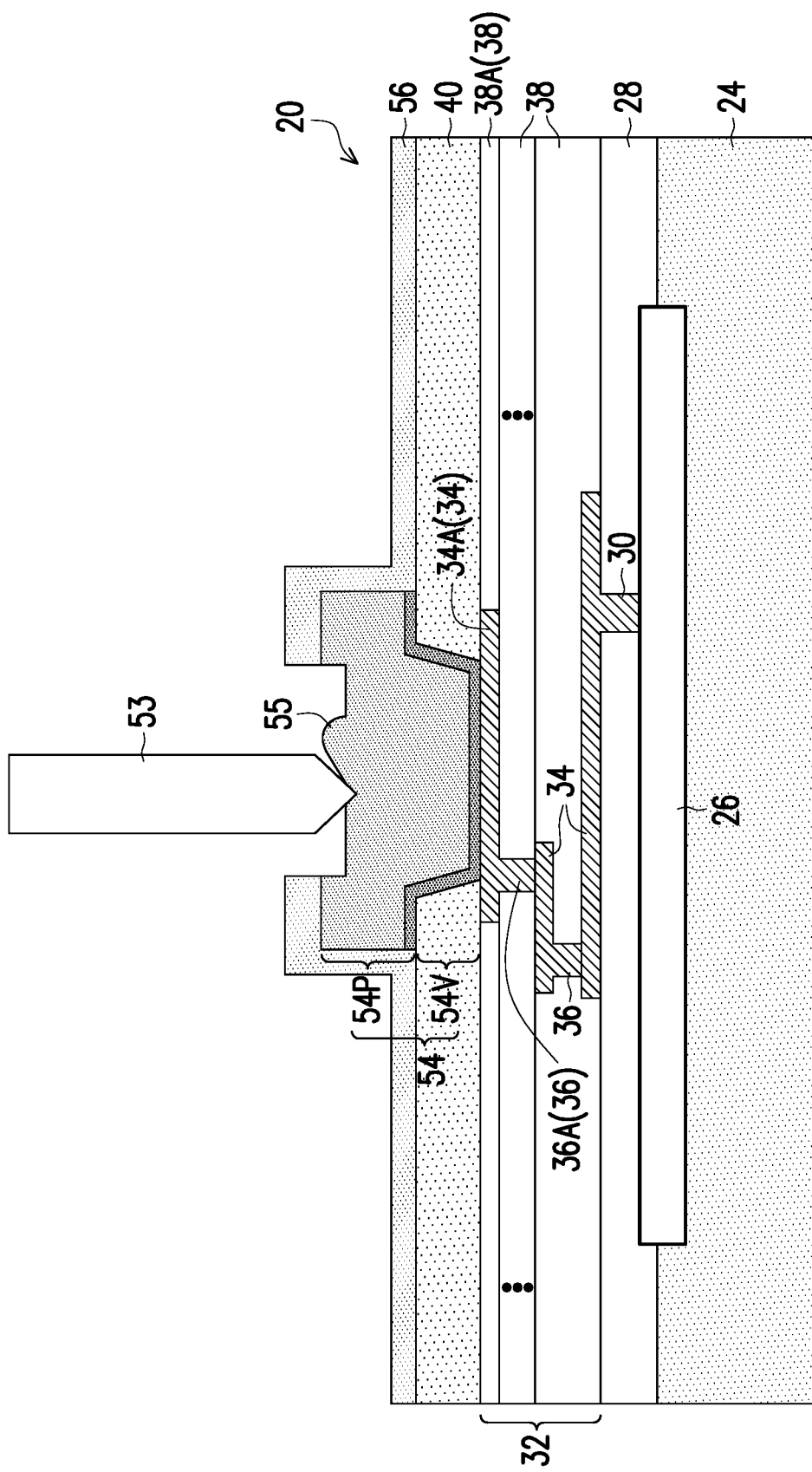

Referring to FIG. 9, passivation layer 56 is patterned through etching, for example, using a photo lithography process. Metal pad 54P is thus exposed. The respective process is illustrated as process 216 in the process flow 200 as shown in FIG. 43. Next, wafer 20 is probed to determine whether the package components such as device dies are defective or not. The respective process is illustrated as process 218 in the process flow 200 as shown in FIG. 43. The probing may be performed by putting a probe card that comprises a plurality of probe pins into contact the metal pads of wafer 20 to determine electrical performance of the corresponding package component. Probe pin 53 is a part of the probe card, and is in contact with metal pad 54P. The probing may result in a bump 55 (probe mark) to be undesirably generated.

Figure 10:
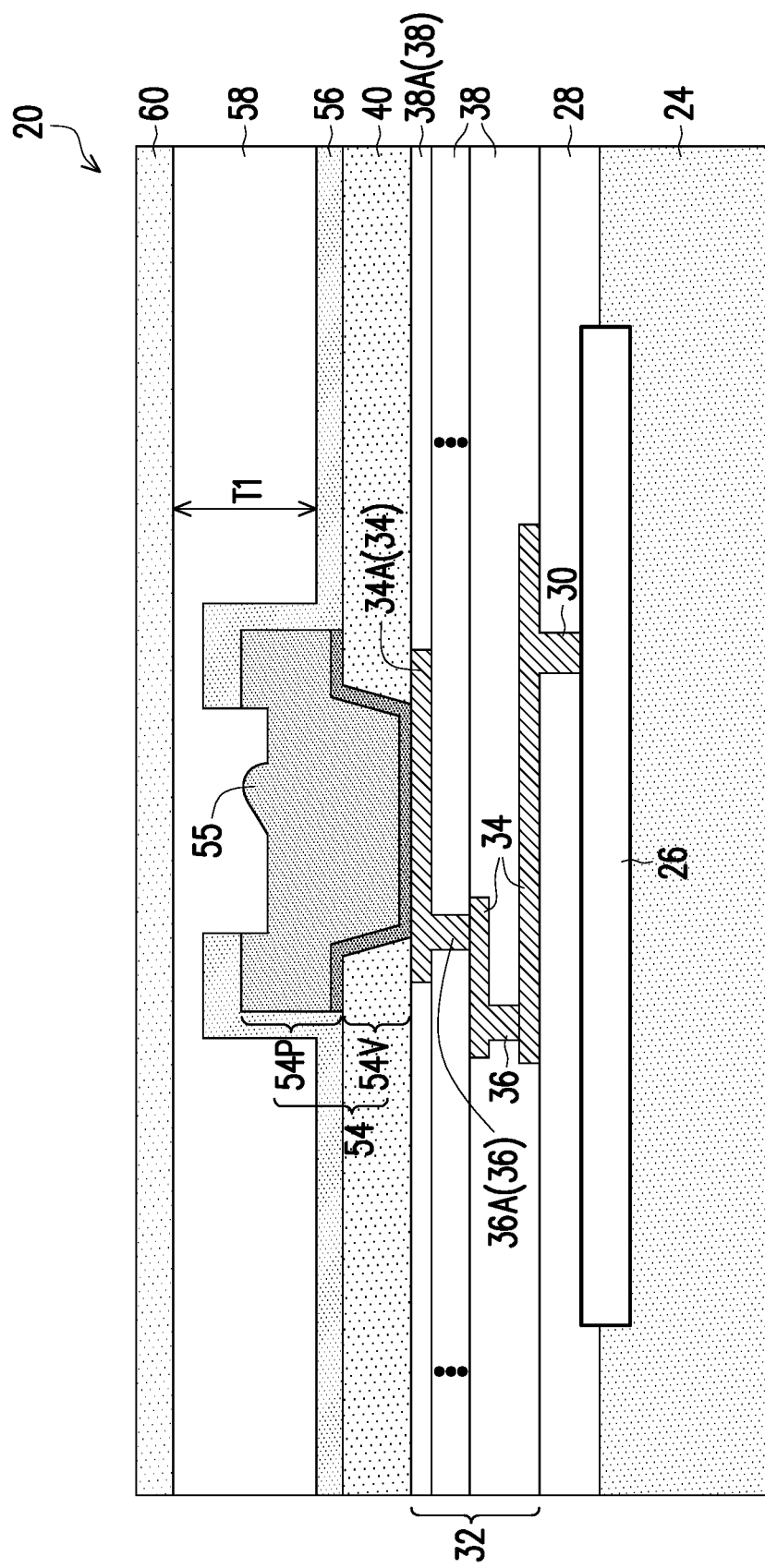

Referring to FIG. 10, planarization layer 58 is deposited. The respective process is illustrated as process 220 in the process flow 200 as shown in FIG. 43. Planarization layer 58 may be formed of or may comprise SiO$_2$, while other dielectric materials such as SiOC, SiON, or the like, may also be used. Planarization layer 58 is formed to have a planar top surface using a deposition method that may achieve the planar top surface as deposited. The deposition method is thus non-conformal, and may be a bottom-up deposition method such as Plasma Enhanced Chemical Vapor Deposition (PECVD), High Density Plasma Chemical Vapor Deposition (HDPCVD), spin-coating, Flowable Chemical Vapor deposition (FCVD), or the like. The top surface of planarization layer 58 as deposited (without going through any planarization process) is planar. For example, the highest point and the lowest point of planarization layer 58 throughout the entire wafer 20 may have a height difference smaller than about 5,000 Å (0.5 μm). To make the planarization layer 58 planar and the height difference small, the thickness T1 may be greater than about 0.8 μm, and may be in the range between about 2.5 μm and about 7 μm. On the other hand, the bottom surface of planarization layer 58 is non-conformal due to the topology of the underlying features.

In accordance with some embodiments, no planarization process is performed on planarization layer 58 between the deposition processes of planarization layer 58 and the deposition of isolation layer 60. In accordance with alternative embodiments, a planarization process is performed on planarization layer 58 before isolation layer 60 is deposited.

Further referring to FIG. 10, isolation layer 60 is deposited on and contacting planarization layer 58. The respective process is illustrated as process 222 in the process flow 200 as shown in FIG. 43. In accordance with some embodiments, isolation layer 60 is formed of or comprises a material that has good moisture-blocking-and-isolation ability to prevent the detrimental substances such as moisture from penetrating-through. For example, isolation layer 60 may be formed of or comprise SiN, SiCN, or the like. In accordance with some embodiments, isolation layer 60 is formed using a conformal deposition process such as CVD, ALD, or the like, and hence isolation layer 60 is conformal. Since the top surface of planarization layer 58 is planar, the top surface of isolation layer 60 is also planar. In accordance with yet alternative embodiments, isolation layer 60 is not formed, and the subsequently applied polymer layer 68 contacts planarization layer 58.

Figure 11:
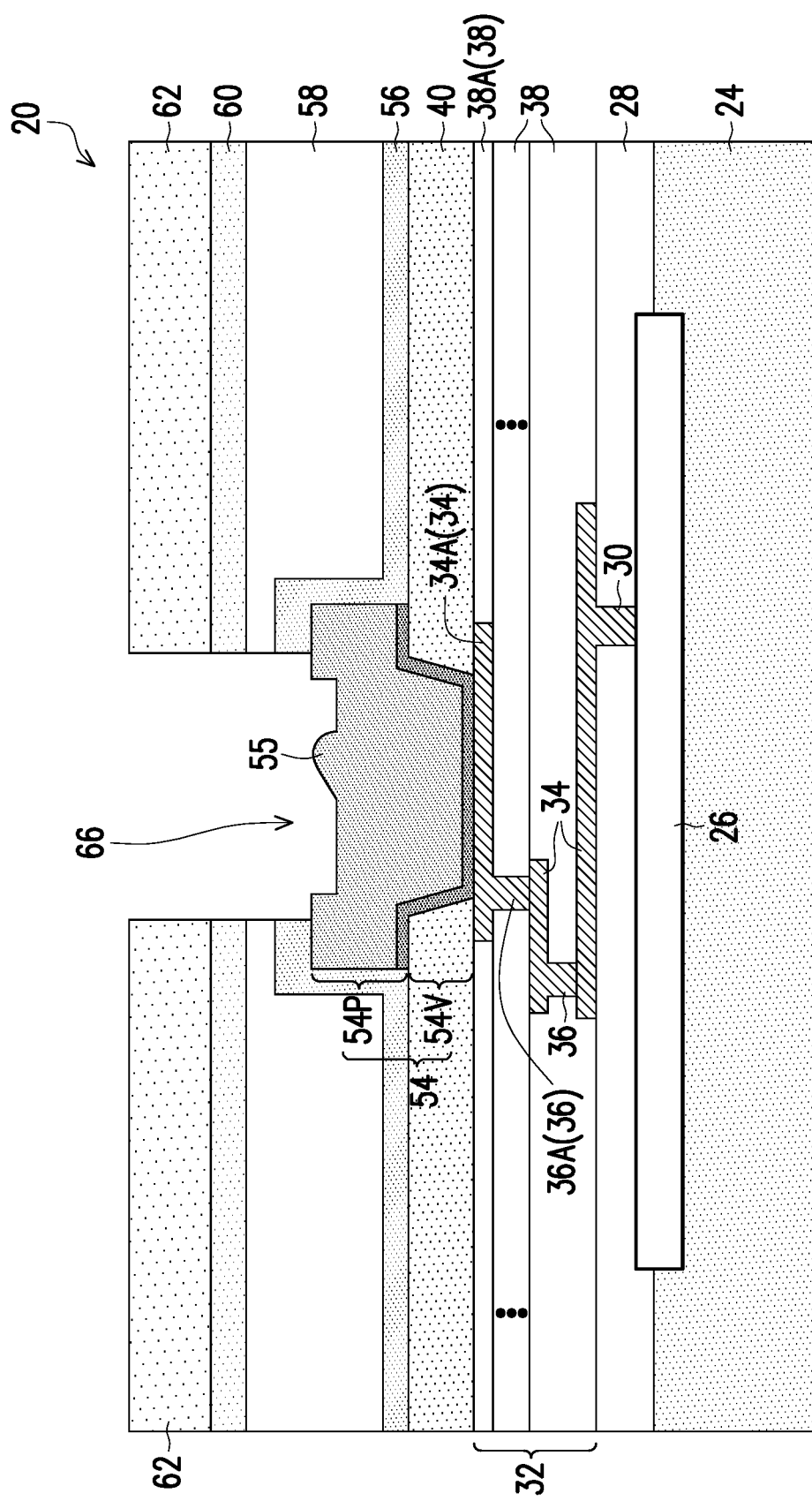

Referring to FIG. 11, a patterned etching mask 62, which may include a patterned photo resist, is formed. An etching process is performed to etch-through isolation layer 60, planarization layer 58, and possibly passivation layer 56, so that opening 66 is formed, again exposing metal pad 54P. The respective process is illustrated as process 224 in the process flow 200 as shown in FIG. 43. In accordance with some embodiments, the etching process is performed through a Reactive Ion Etching (RIE) process.

Figure 12:
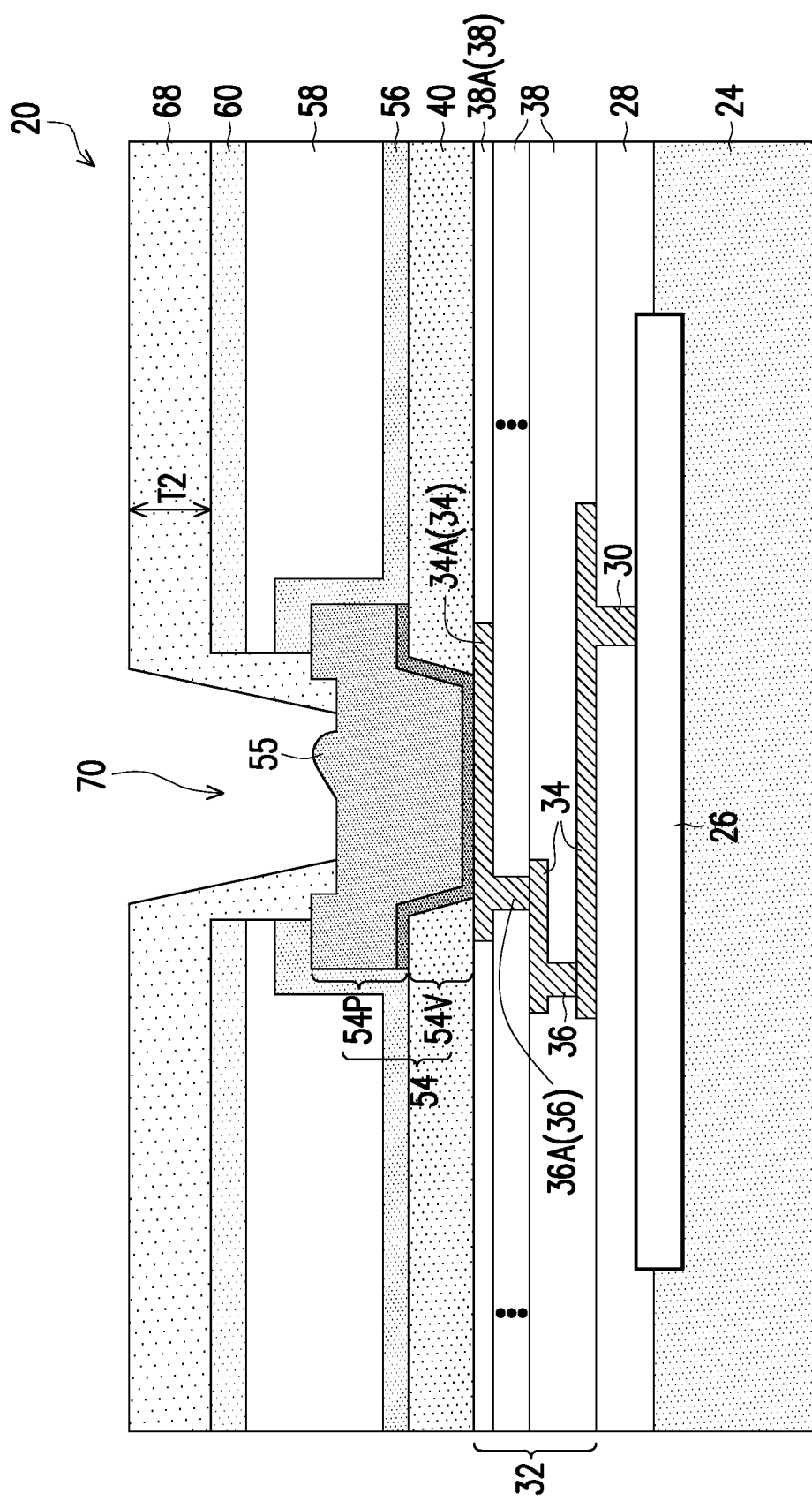

Referring to FIG. 12, polymer layer 68 is dispensed. The respective process is illustrated as process 226 in the process flow 200 as shown in FIG. 43. Due to the planar top surface of planarization layer 58, the top surface of polymer layer 68 throughout wafer 20 is more planar than if planarization layer 58 is not formed. Polymer layer 68 is then patterned, forming opening 70. The respective process is illustrated as process 228 in the process flow 200 as shown in FIG. 43. The polymer in polymer layer 68 may be photo sensitive or non-photo-sensitive. The photo sensitive polymer for forming polymer layer 68 may comprise polyimide, polybenzoxazole (PBO), benzocyclobutene (BCB), or the like. The patterning of polymer layer 68, when it is photo sensitive, may include performing a photo-exposure process on the polymer layer 68, and then developing polymer layer 68 to form opening 70. In accordance with alternative embodiments in which polymer layer 68 is non-photo-sensitive, for example, when polymer layer 68 comprises a non-photo-sensitive epoxy/polymer, the patterning of polymer layer 68 may include applying and patterning a photo resist over the polymer layer 68, and etching the polymer layer 68 using the patterned photo resist to define patterns of openings. Due to the planar top surface of planarization layer 58, the top surface of polymer layer 68 is planar without the need of increasing the thickness of polymer layer 68. For example, the thickness of polymer layer 68 may be greater than about 2,000 nm (2 μm), and may be smaller than about 10,000 nm (10 μm) in accordance with some embodiments.

Figure 13A:
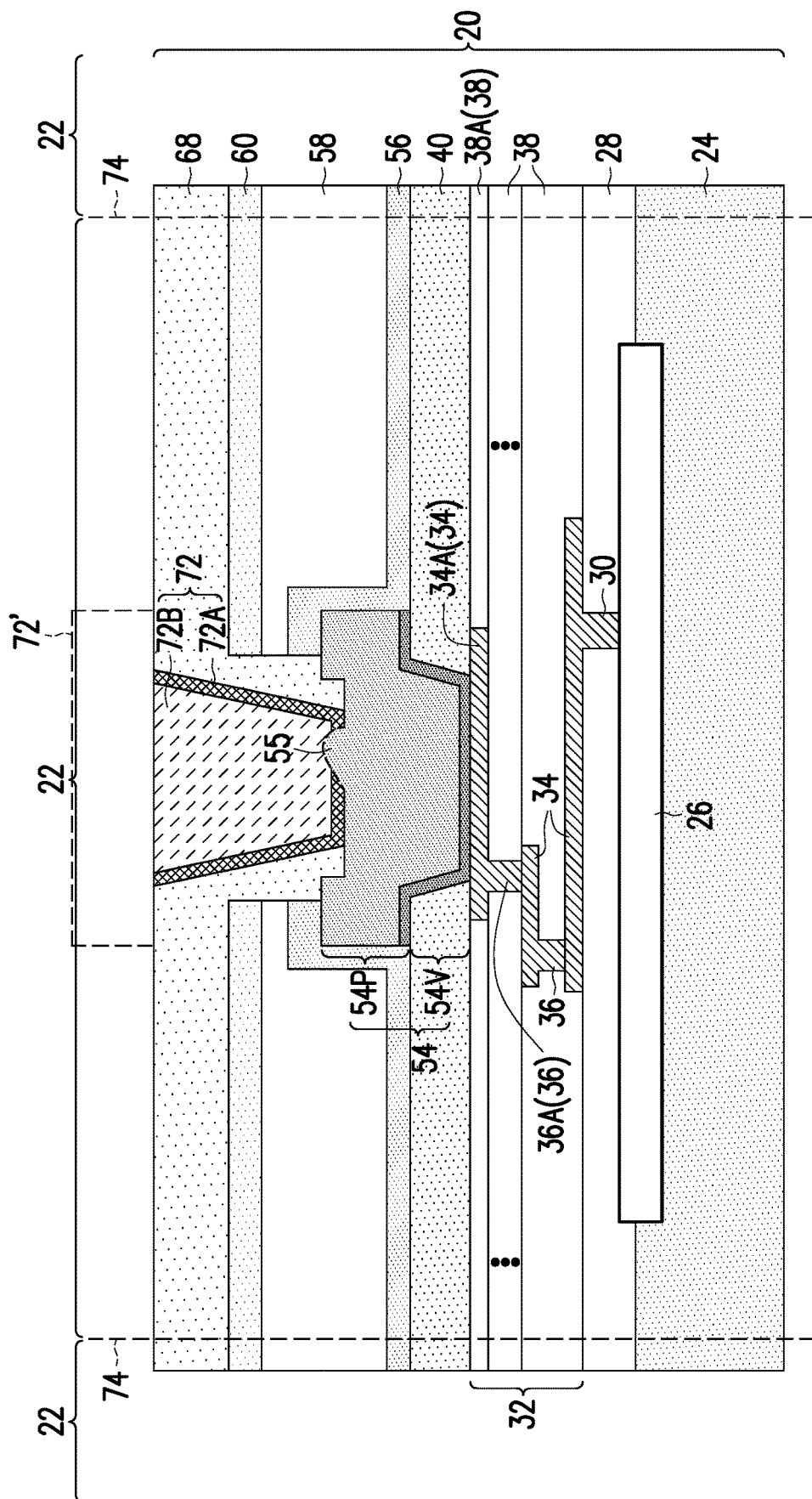
Figure 13B:
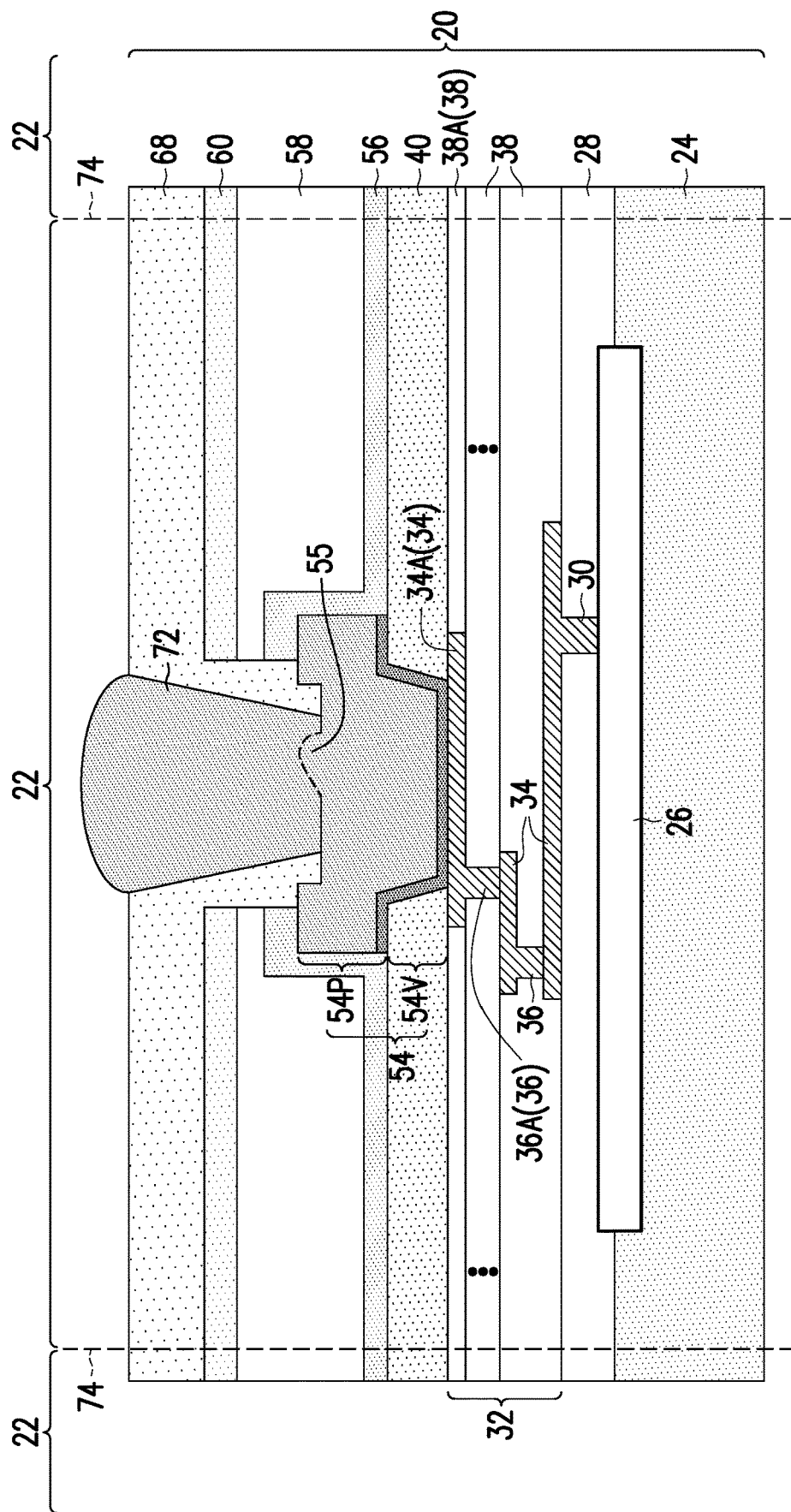

FIGS. 13A and 13B illustrate the formation of bonding feature 72 in opening 70. The respective process is illustrated as process 230 in the process flow 200 as shown in FIG. 43. In accordance with some embodiments, as shown in FIG. 13A, bonding feature 72 comprises adhesion layer 72A, and metallic material 72B on adhesion layer 72A. The adhesion layer 72A may comprise Ti, TiN, Ta, TaN, or the like. The metallic material 72B may comprise copper or a copper alloy, palladium, nickel, and/or the like, or composite layers thereof. The bonding feature 72 may be planarized in a Chemical Mechanical Polish (CMP) process, so that its top surface is coplanar with the top surface of polymer layer 68. In accordance with alternative embodiments, bonding feature 72 includes a portion higher than the top surface of polymer layer 68, which portion is represented by dashed lines 72'.

In accordance with alternative embodiments, as shown in FIG. 13B, bonding feature 72 comprises a solder region, which may be formed through plating and then reflowing solder, or through placing a solder region into opening 70, and then reflowing the solder region.

In a subsequent process, as shown in FIGS. 13A and 13B, wafer 20 is singulated, for example, sawed along scribe lines 74 to form individual device dies 22. The respective process is illustrated as process 232 in the process flow 200 as shown in FIG. 43. Device dies 22 are also referred to as devices 22 or package components 22 since devices 22 may be used for bonding to other package components in order to form packages. As aforementioned, devices 22 may be device dies, interposers, package substrate, packages, or the like.

Figure 14:
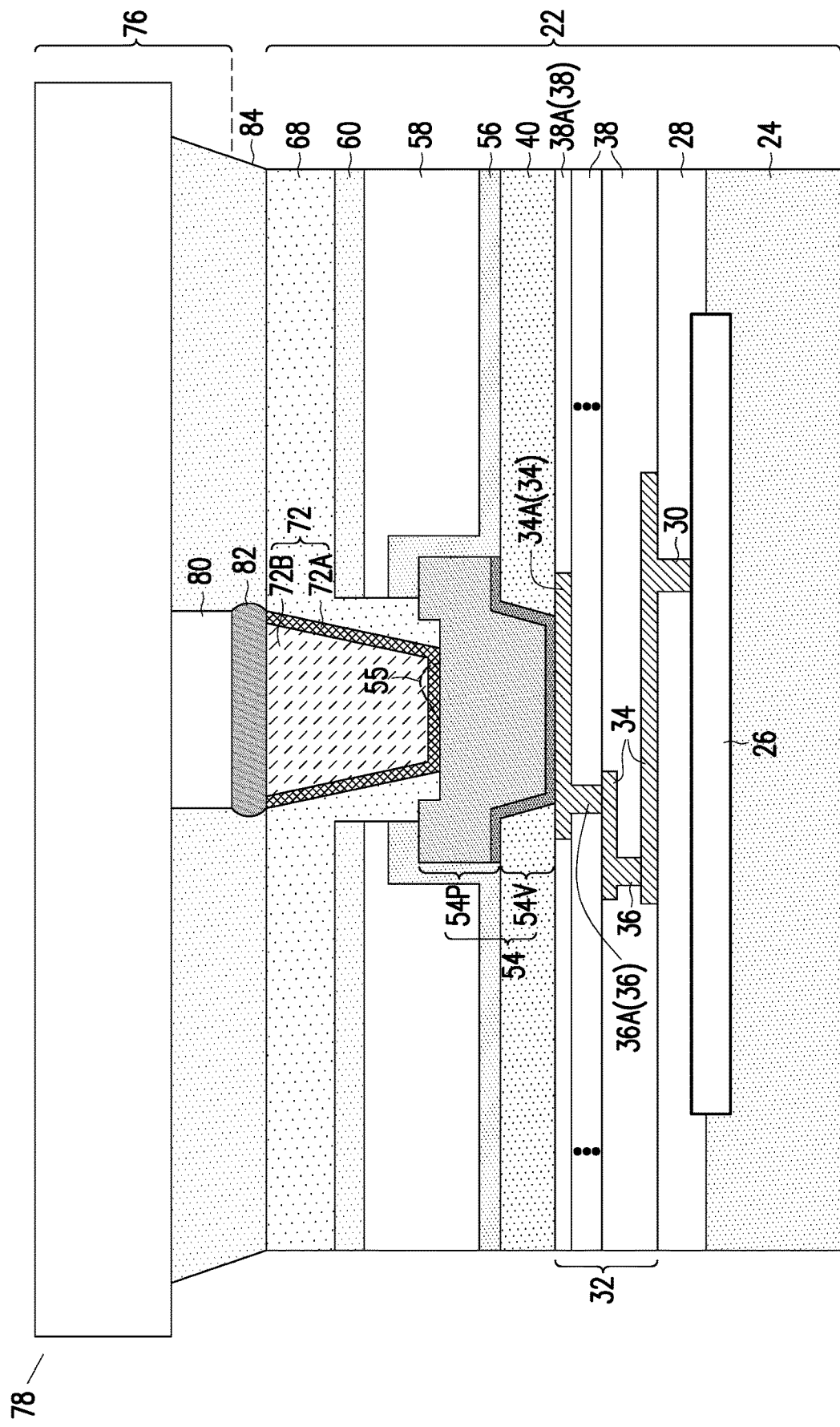

Referring to FIG. 14, device 22 is bonded with package component 76 to form package 78. The respective process is illustrated as process 234 in the process flow 200 as shown in FIG. 43. In accordance with some embodiments, package component 76 is or comprises an interposer, a package substrate, a printed circuit board, a package, or the like. Electrical connector 80 in package component 76 may be bonded to package component 76 through solder region 82. Underfill 84 is dispensed between device 22 and package component 76.

FIGS. 15-20, 21-25, 26-30, and 31-35 illustrate the cross-sectional views of intermediate stages in the formation of passivation layers and bonding structures in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1-12, 13A, 13B, and 14. The details regarding the formation process and the materials of the components shown in FIGS. 15-20, 21-25, 26-30, and 31-35 may thus be found in the discussion of the preceding embodiments.

FIGS. 15 through 20 illustrate the process for forming planar passivation structures in accordance with some embodiments. These embodiments are similar to the embodiments shown in FIGS. 1-12, 13A, 13B, and 14, except that the isolation layer 60 as shown in FIG. 14 is not formed, and planarization layer 58 is planarized in a planarization process.

Figure 15:
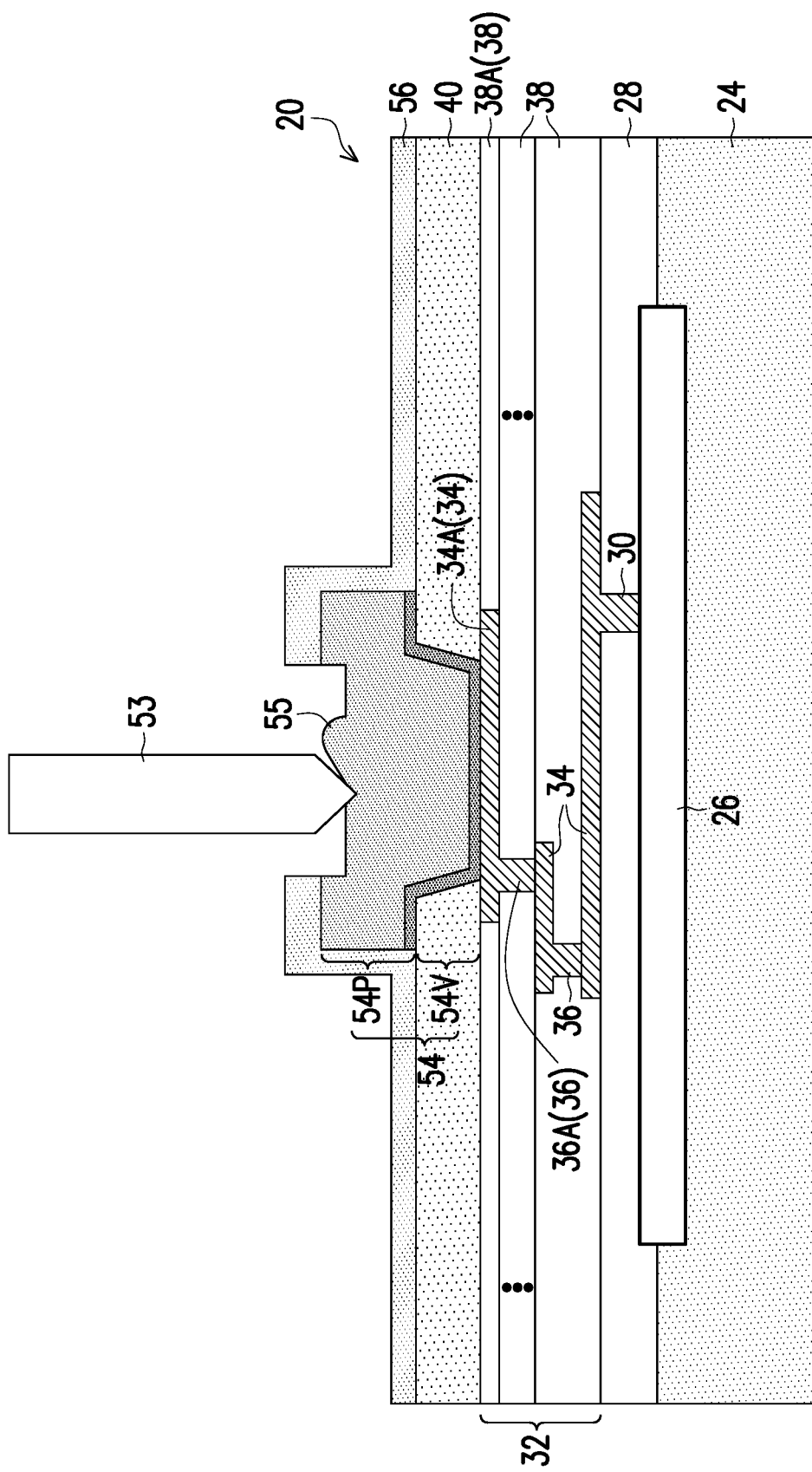
FIGS. 15 through 20 illustrate the cross-sectional views of intermediate stages in the formation of a package component in accordance with some embodiments.
Figure 16:
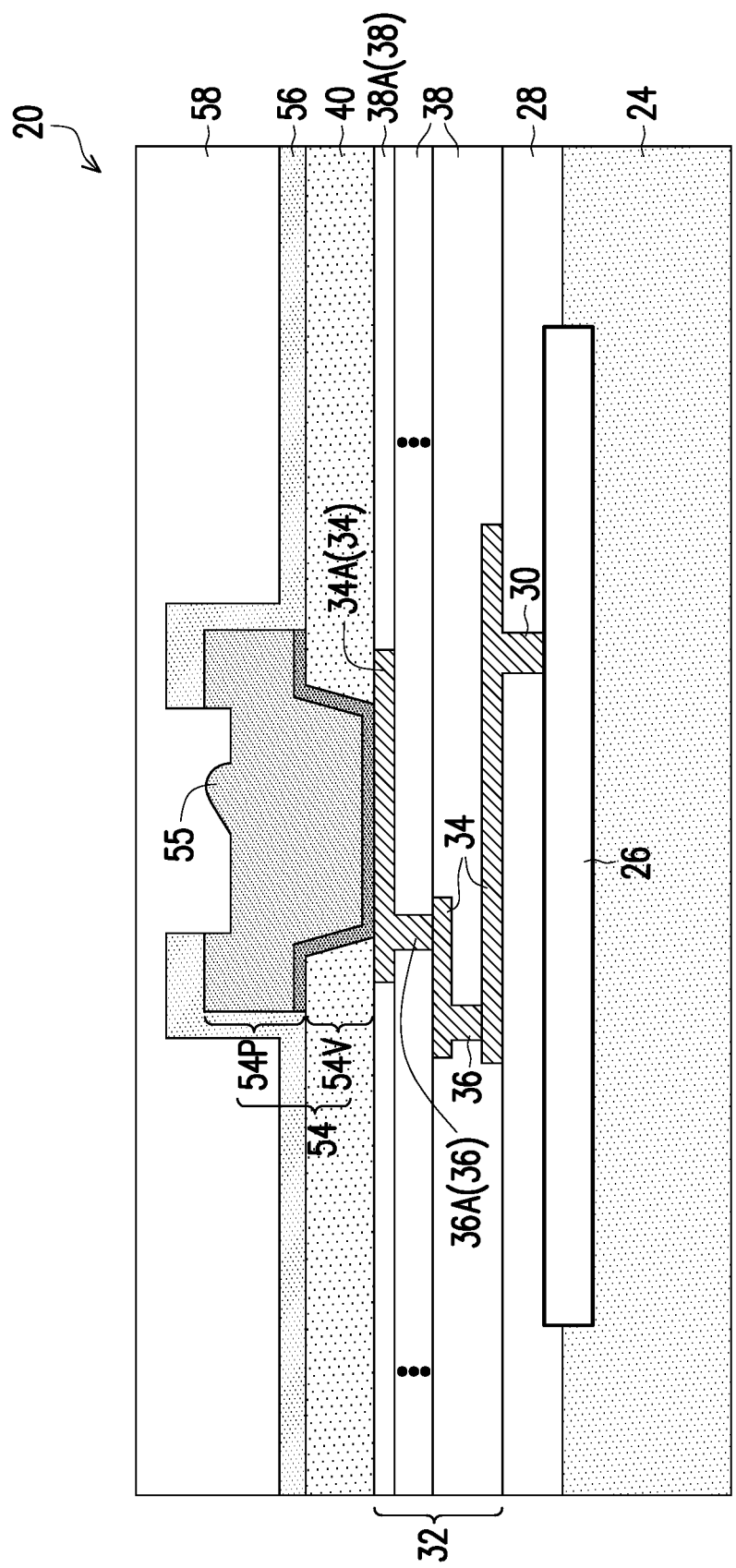

The initial processes of these embodiments are the same as shown in FIGS. 1-8. Next, as shown in FIG. 15, a probing process is performed using probe pin 53, which process is the same as the probing process as shown in FIG. 9, and the details are not repeated herein. Probe mark 55 may be generated. Next, referring to FIG. 16, planarization layer 58 is deposited. Planarization layer 58 may be formed of or may comprise $SiO_2$, while other dielectric materials such as SiOC, SiON, or the like, may also be used. Planarization layer 58 may also be formed of a material having isolation ability to detrimental substances such as moisture, and the material may include SiN, SiCN, or the like. Accordingly, planarization layer 58 may integrate the functions of both of the planarization layer and the isolation layer. Planarization layer 58 may be formed using a selected deposition method that results in a planar top surface. For example, the deposition method may include a non-conformal deposition method, which may also be a bottom-up deposition method such as PECVD, HDPCVD, spin-coating, Flowable Chemical Vapor deposition (FCVD), or the like. After the deposition, planarization layer 58 is not planarized, while it may also be planarized to have a more planar surface.

Figure 17:
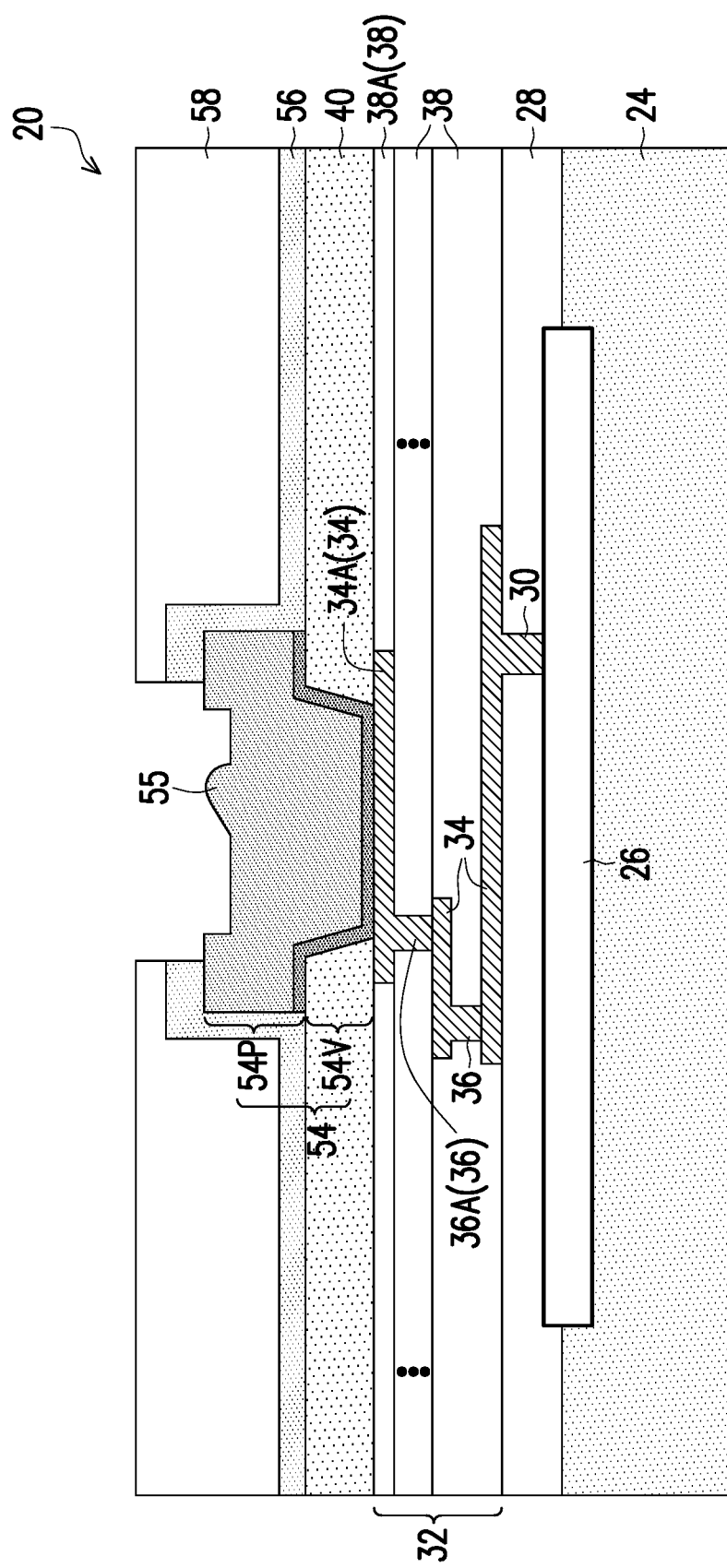

Next, as shown in FIG. 17, planarization layer 58 is patterned in an etching process, which is performed using a lithography mask. In the etching process, passivation layer 56 may also be patterned, to that the edges of planarization layer 58 are vertically aligned to the corresponding edges of passivation layer 56.

Figure 18:
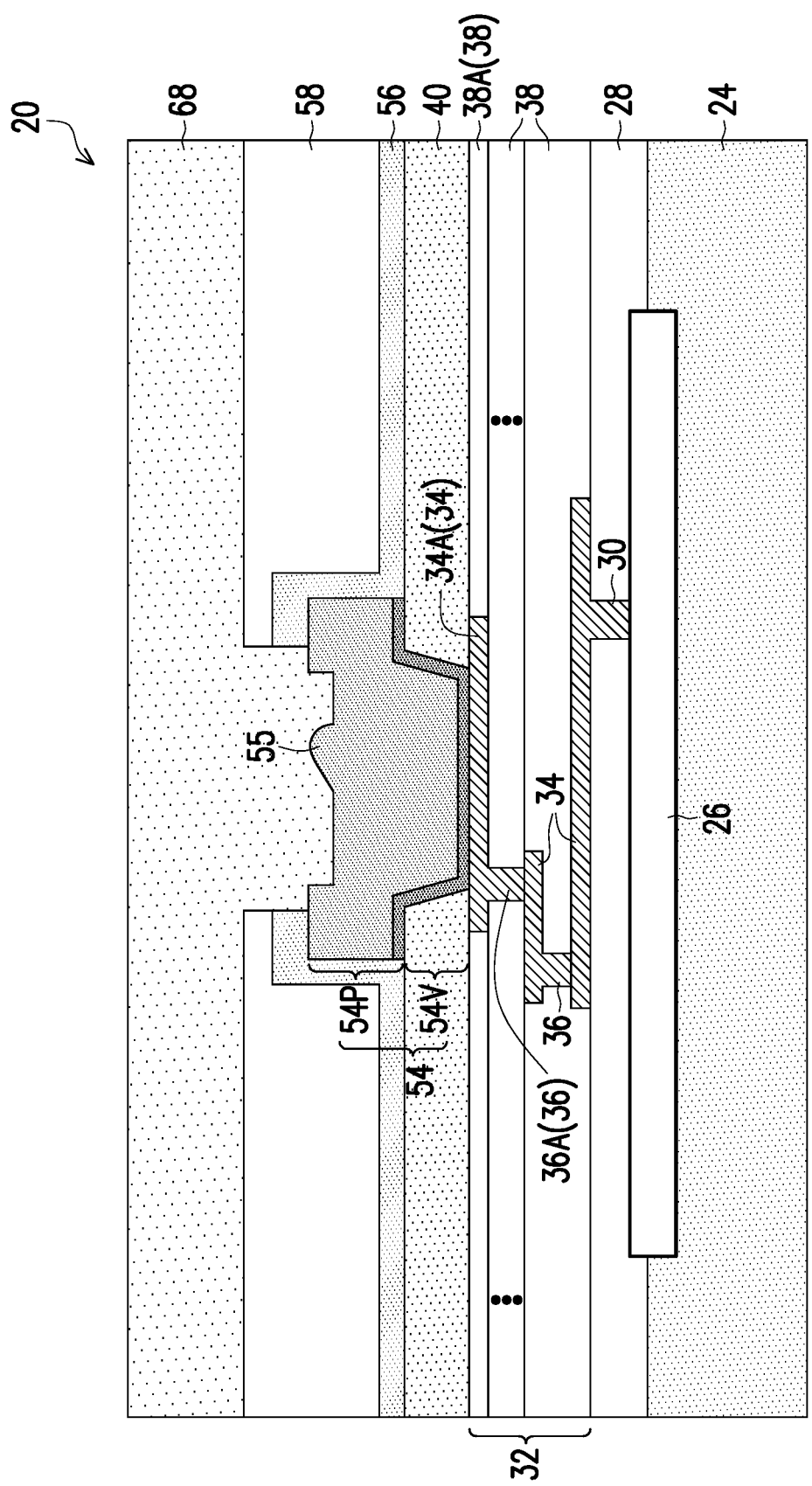
Figure 19:
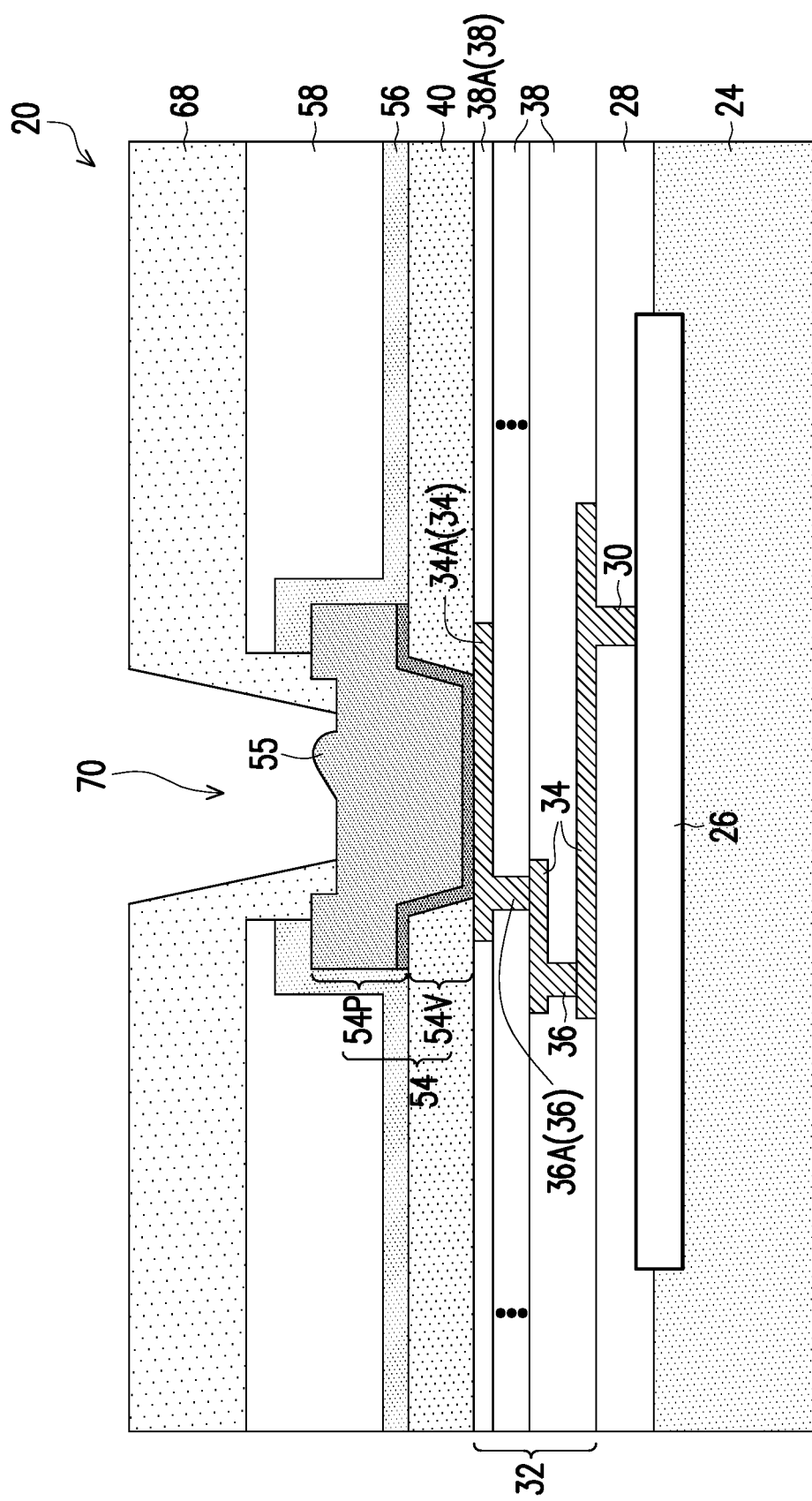

Referring to FIG. 18, polymer layer 68 is applied. Since the top surface of planarization layer 58 is planar, the top surface of polymer layer 68 is more planar than if planarization layer 58 is not formed. Next, as shown in FIG. 19, polymer layer 68 is patterned to form opening 70, for example, through a light-exposure process and a development process when polymer layer 68 is photo sensitive. Otherwise, when polymer layer 68 is not photo sensitive, polymer layer 68 is etched through a photo lithography process.

Figure 20:
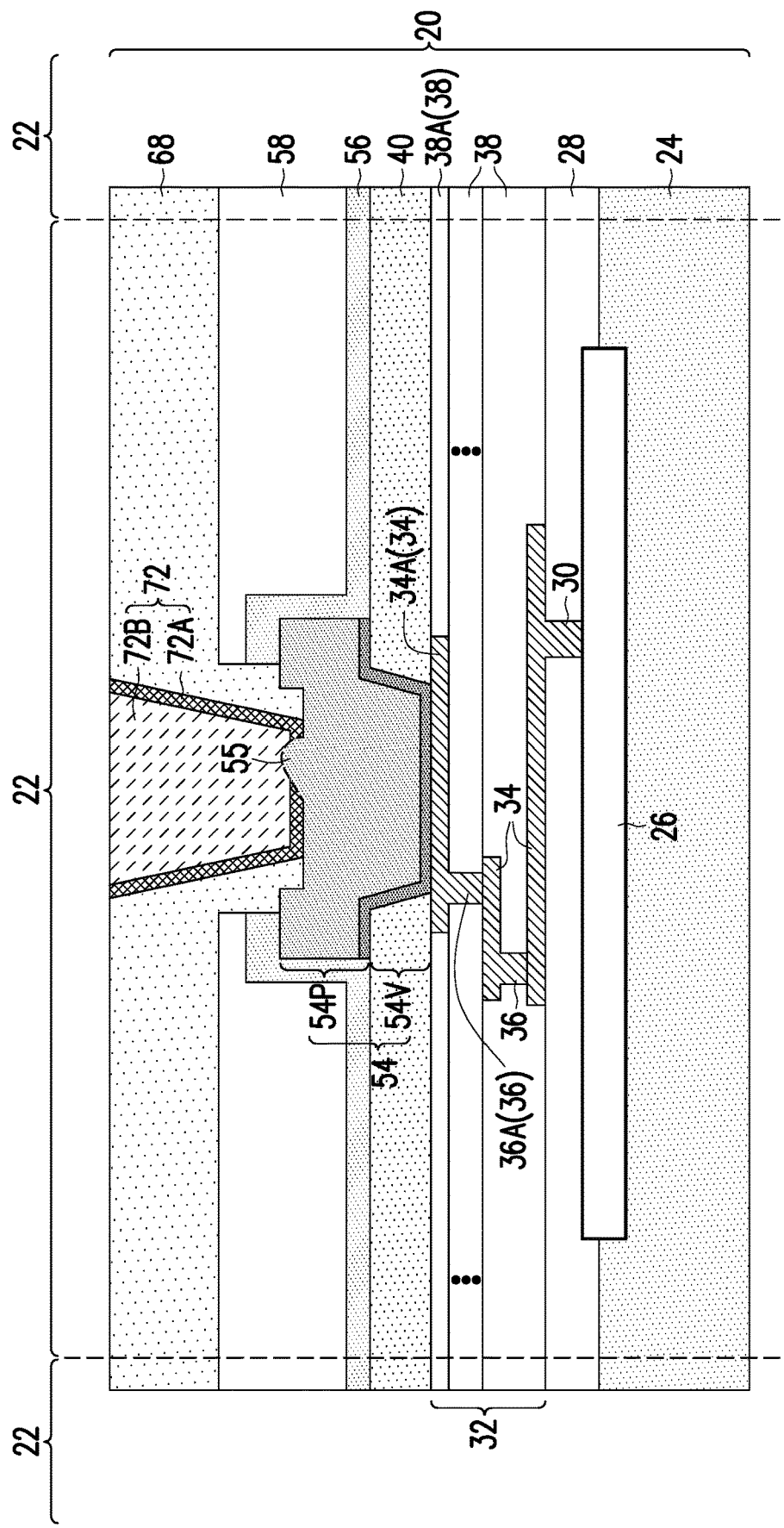

FIG. 20 illustrates the bonding feature 72 in accordance with some embodiments. In accordance with alternative embodiments, bonding feature 72 may be a solder region, which is shown in FIG. 13B. In a subsequent process, wafer 20 is singulated into discrete devices 22. Device 22 may be bonded to another package component 76, which is shown in FIG. 14.

FIGS. 21 through 25 illustrate the process for forming planar passivation structures in accordance with some embodiments. These embodiments are similar to the embodiments shown in FIGS. 1-12, 13A, 13B, and 14, except planarization layer 58 is planarized, and that the isolation layer 60 as shown in FIG. 14 is not formed.

Figure 21:
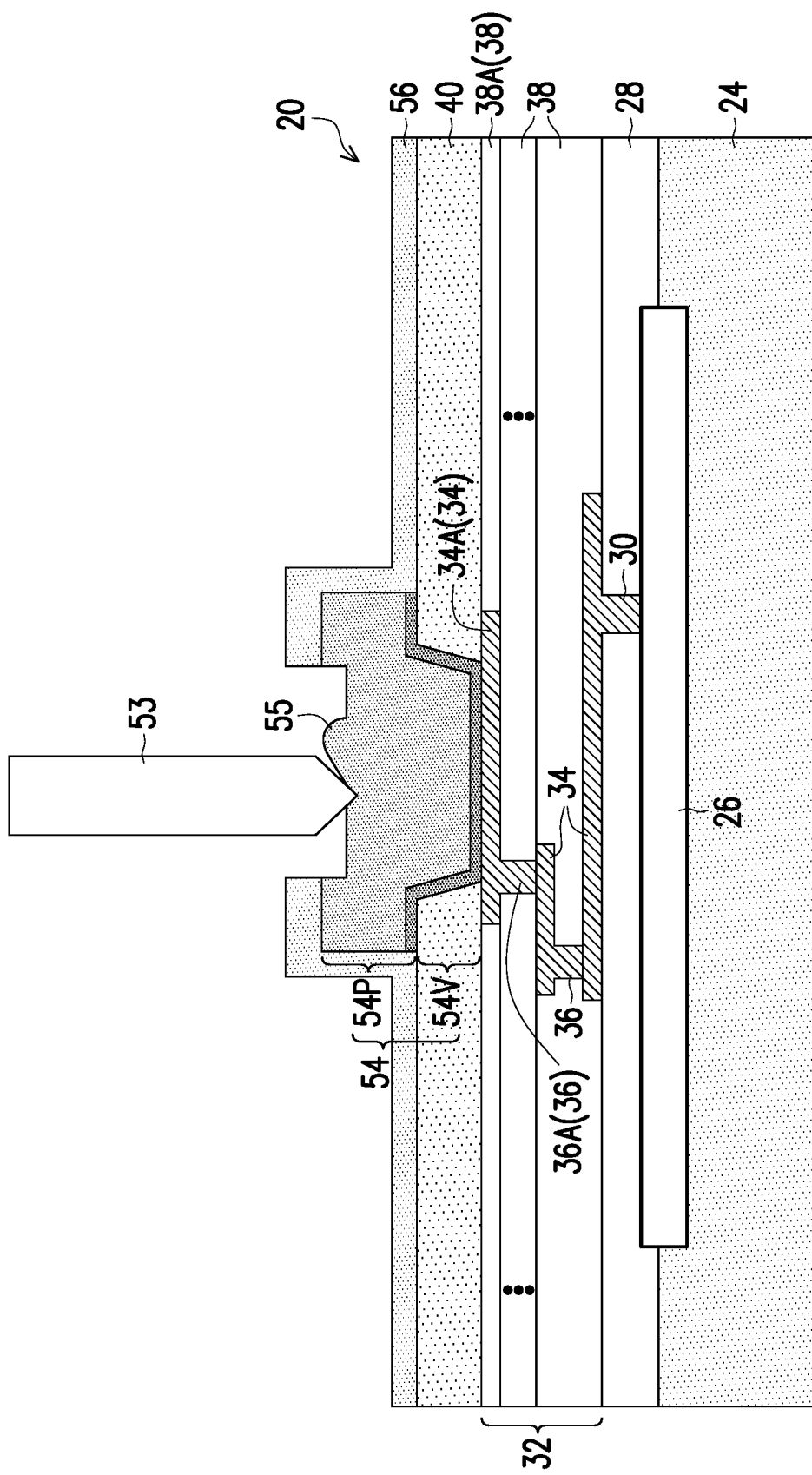
FIGS. 21 through 25 illustrate the cross-sectional views of intermediate stages in the formation of a package component in accordance with some embodiments.
Figure 22:
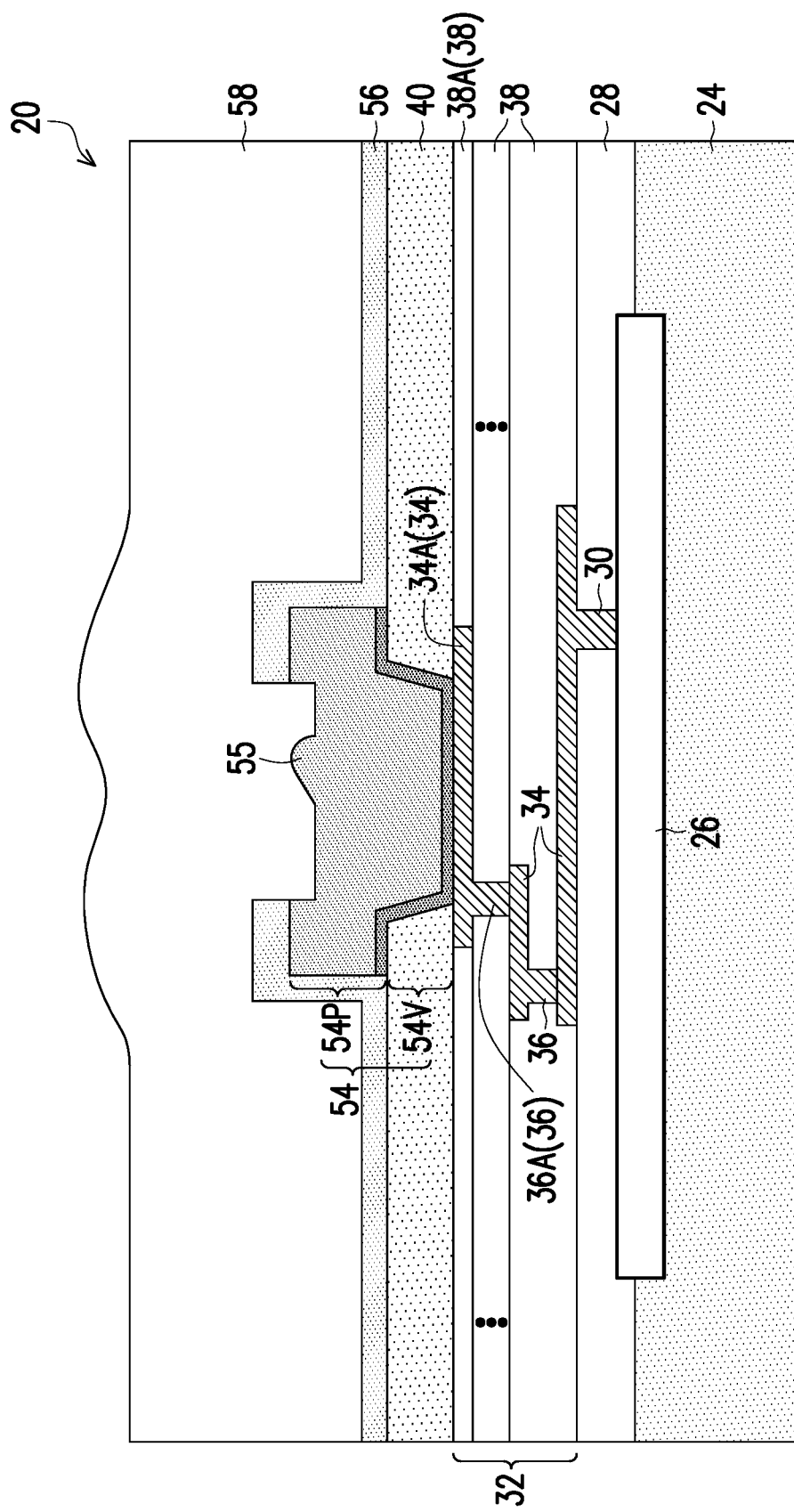

The initial processes of these embodiments are the same as shown in FIGS. 1-8. Next, as shown in FIG. 21, a probing process is performed, which process is the same as the probing process as shown in FIG. 9, and the details are not repeated herein. Probe mark 55 may be generated. Next, referring to FIG. 22, planarization layer 58 is deposited. Planarization layer 58 may comprise or may be formed of SiO$_2$, while other dielectric materials such as SiOC, SiON, or the like, may also be used. Planarization layer 58 may also be formed of a material having isolation ability to detrimental substances such as moisture, and the material may include SiN, SiCN, or the like. Accordingly, planarization layer 58 integrates the functions of both of the planarization layer and the isolation layer. Planarization layer 58 is formed either through a conformal deposition process such as CVD, ALD, or the like, or a non-conformal deposition process such as PECVD, HDPCVD, spin-coating, Flowable Chemical Vapor deposition (FCVD), or the like.

Figure 23:
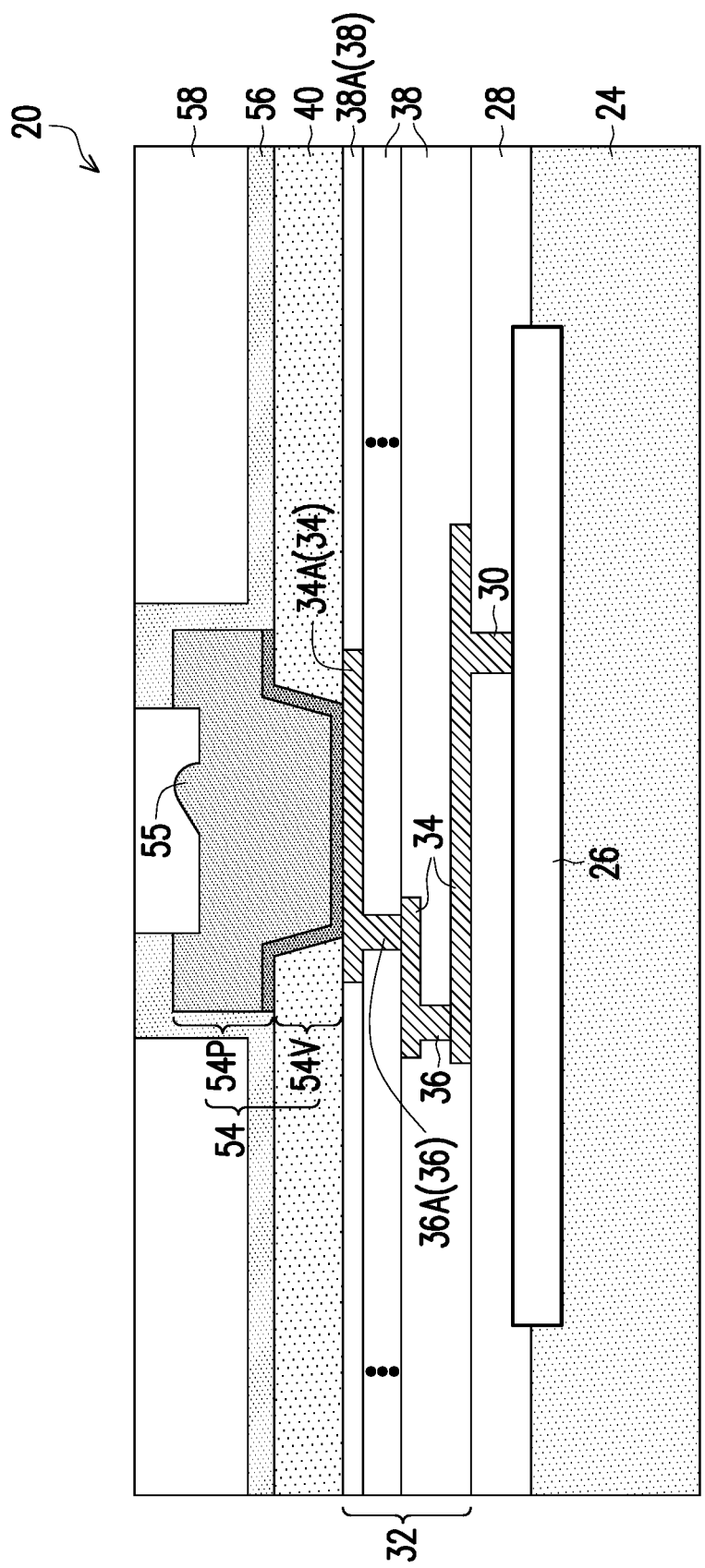
Figure 24:
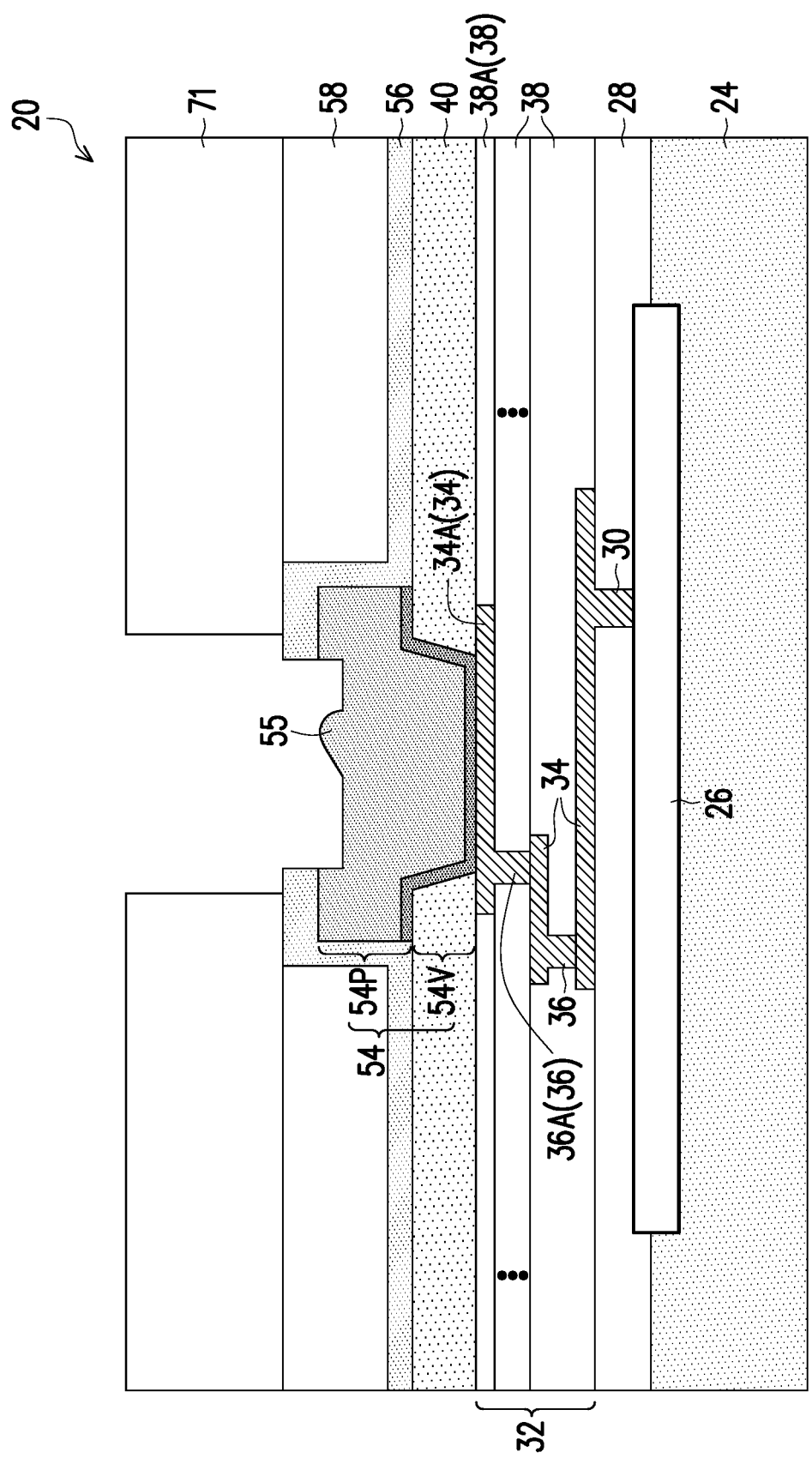

A planarization process such as a Chemical Mechanical Polish (CMP) process or a mechanical polishing process is then performed to level the top surfaces of planarization layer 58 and passivation layer 56, as shown in FIG. 23. Due to the planarization process, the top surfaces of both of planarization layer 58 and passivation layer 56 comprise scratching marks, which are the parallel shallow grooves caused by the scratching of slurry on planarization layer 58 and passivation layer 56. This may be used to identify whether a planarization process is performed or not. The scratching marks are in local regions (not at the wafer level) of the surfaces of planarization layer 58 and passivation layer 56, and in different local regions, the directions of the scratching marks and the depths may be different from each other. An etching mask 71 is then formed and patterned, as shown in FIG. 24, and is used to remove the portion of planarization layer 58 directly over metal pad 54P. The etching may be performed using an etching chemical that etches planarization layer 58, but does not etch passivation layer 56. Accordingly, passivation layer 56 may extend laterally beyond edges of planarization layer 58. Etching mask 71 is then removed.

Figure 25:
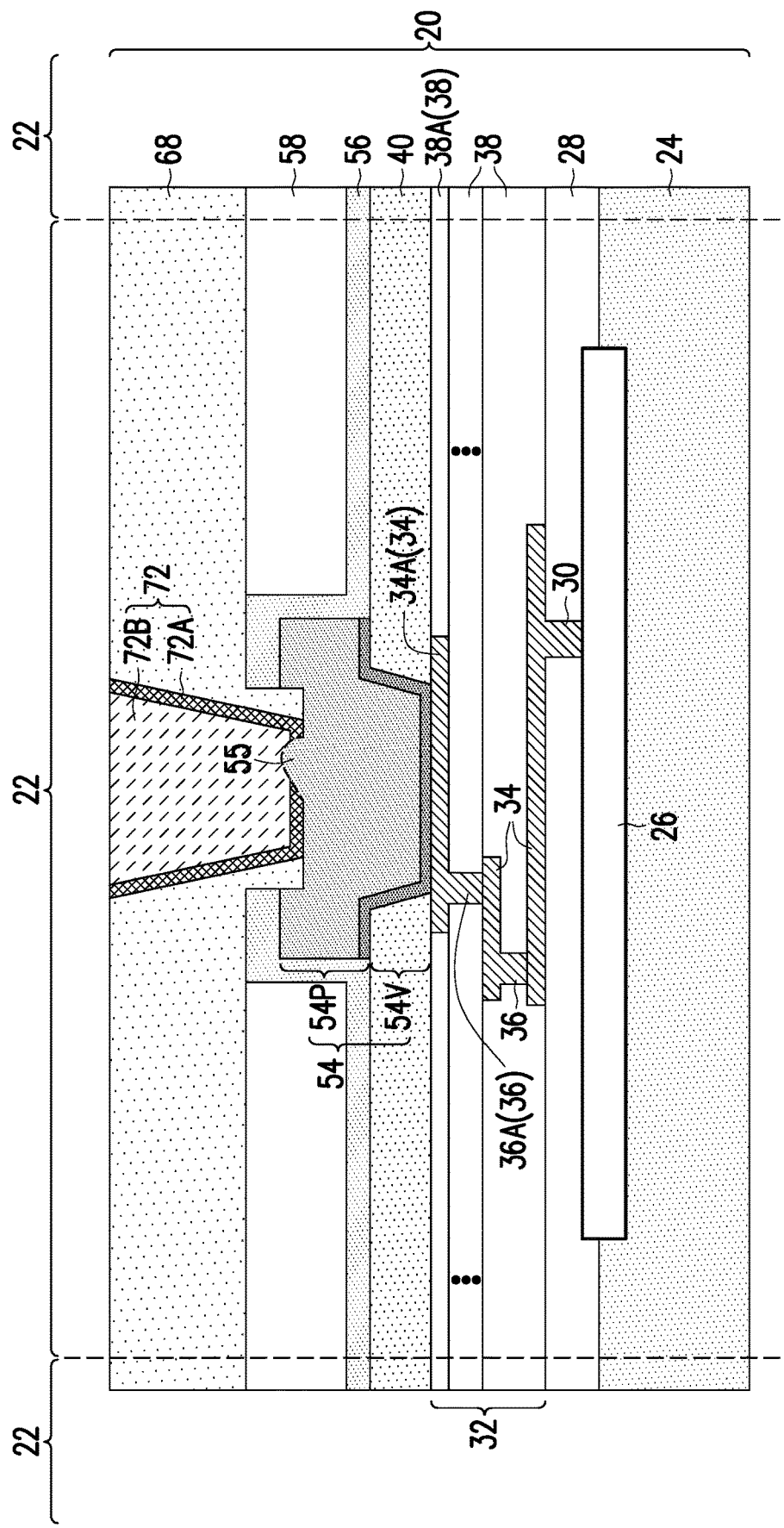

Referring to FIG. 25, polymer layer 68 is applied. Since the top surfaces of planarization layer 58 and passivation layer 56 are coplanar, the top surface of polymer layer 68 is planar. Next, polymer layer 68 is patterned, for example, through a light-exposure process and a development process when polymer layer 68 is photo sensitive. Otherwise, when polymer layer 68 is not photo sensitive, polymer layer 68 is etched through a photo lithography process.

FIG. 25 also illustrates the formation of bonding feature 72 in accordance with some embodiments. In accordance with alternative embodiments, bonding feature 72 may be a solder region, which is shown in FIG. 13B. In a subsequent process, wafer 20 is singulated into discrete devices 22. Device 22 may be bonded to another package component 76, which is shown in FIG. 14.

FIGS. 26 through 30 illustrate the process for forming planar passivation structures in accordance with some embodiments. These embodiments are similar to the embodiments shown in FIGS. 1-12, 13A, 13B, and 14, except planarization layer 58 is planarized through a planarization process, and that the isolation layer 60 as shown in FIG. 14 is not formed. Due to the planarization process, the top surface of planarization layer 58 comprises scratching marks, which are the parallel shallow grooves caused by the scratching of slurry on planarization layer 58. This may be used to identify whether a planarization process is performed or not.

Figure 26:
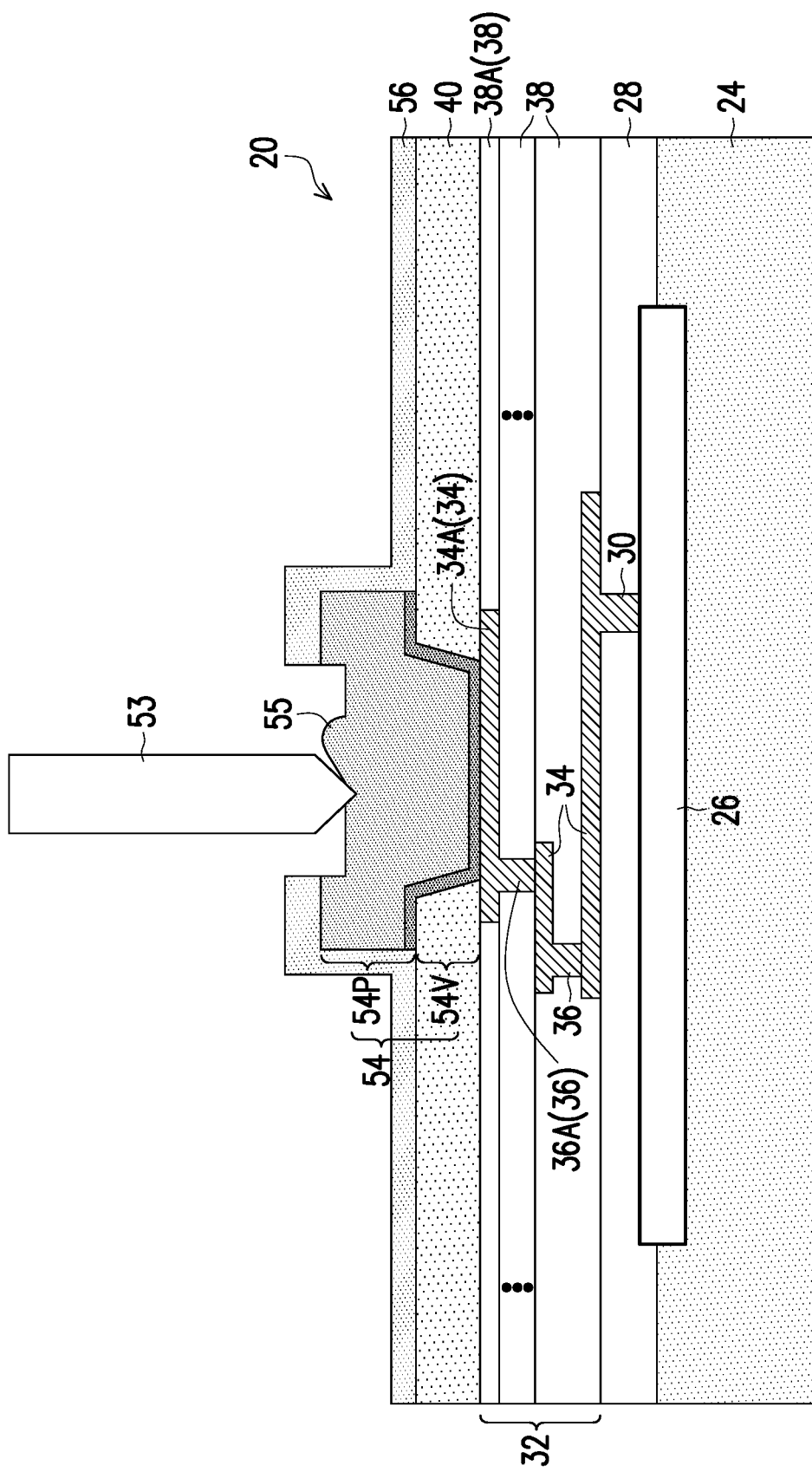
FIGS. 26 through 30 illustrate the cross-sectional views of intermediate stages in the formation of a package component in accordance with some embodiments.
Figure 27:
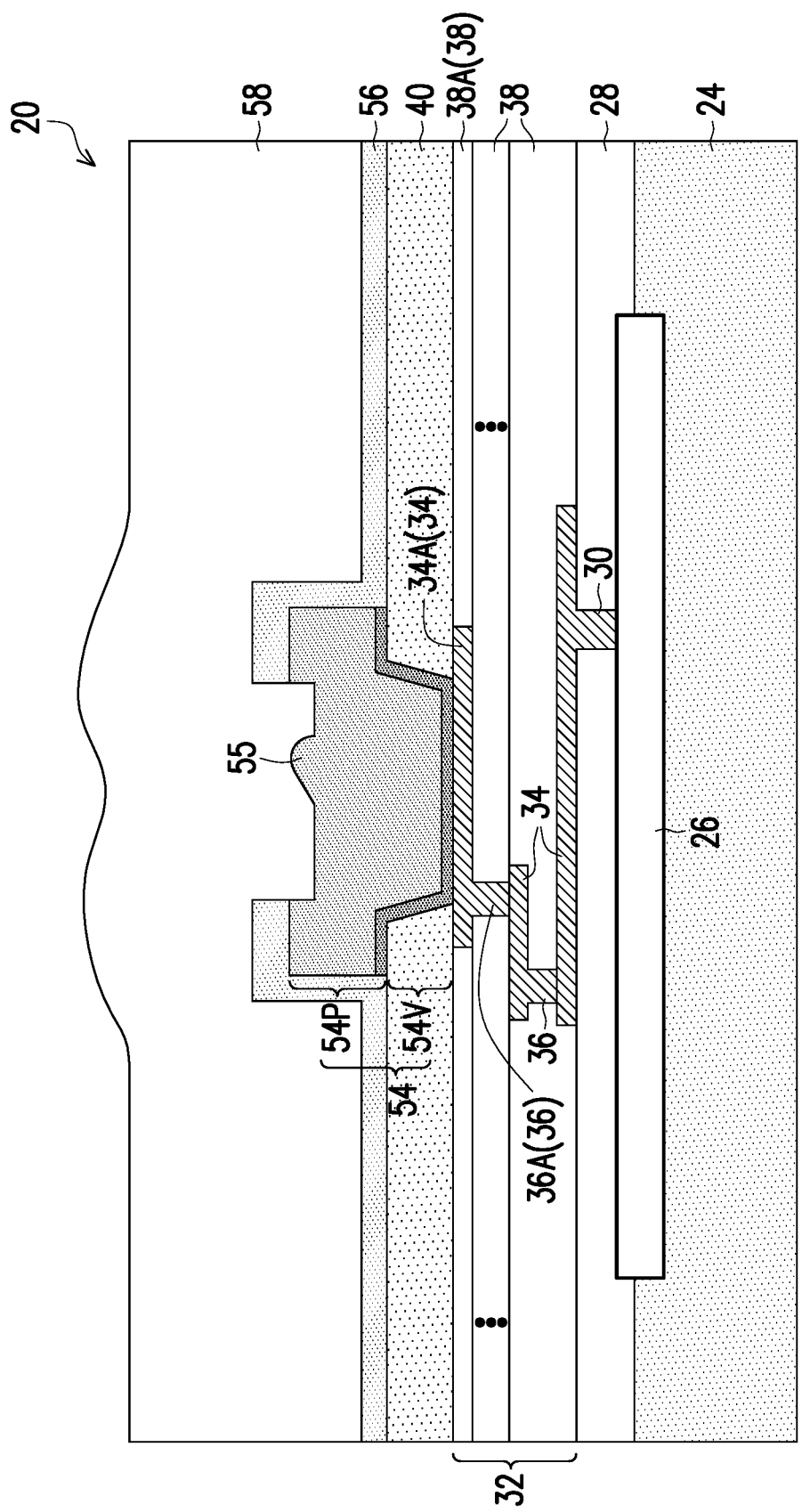

The initial processes of these embodiments are the same as shown in FIGS. 1-8. Next, as shown in FIG. 26, passivation layer 56 is formed and patterned. A probing process is performed using probe pin 53, which process is the same as the probing process as shown in FIG. 9, and the details are not repeated herein. Probe mark 55 may be generated. Next, referring to FIG. 27, planarization layer 58 is deposited. Planarization layer 58 may be formed of or may comprise SiO$_2$, while other dielectric materials such as SiOC, SiON, or the like, may also be used. Planarization layer 58 may also be formed of a material having isolation ability to detrimental substances such as moisture, and the material may include SiN, SiCN, or the like. Accordingly, planarization layer 58 integrates the functions of both of the planarization layer and the isolation layer. Planarization layer 58 is formed either through a conformal deposition process such as CVD, ALD, or the like, or a non-conformal deposition process such as PECVD, HDPCVD, spin-coating, Flowable Chemical Vapor deposition (FCVD), or the like. Accordingly, the top surface of planarization layer 58 may have the topology of the underlying features, or may be more planar than the underlying features.

Figure 28:
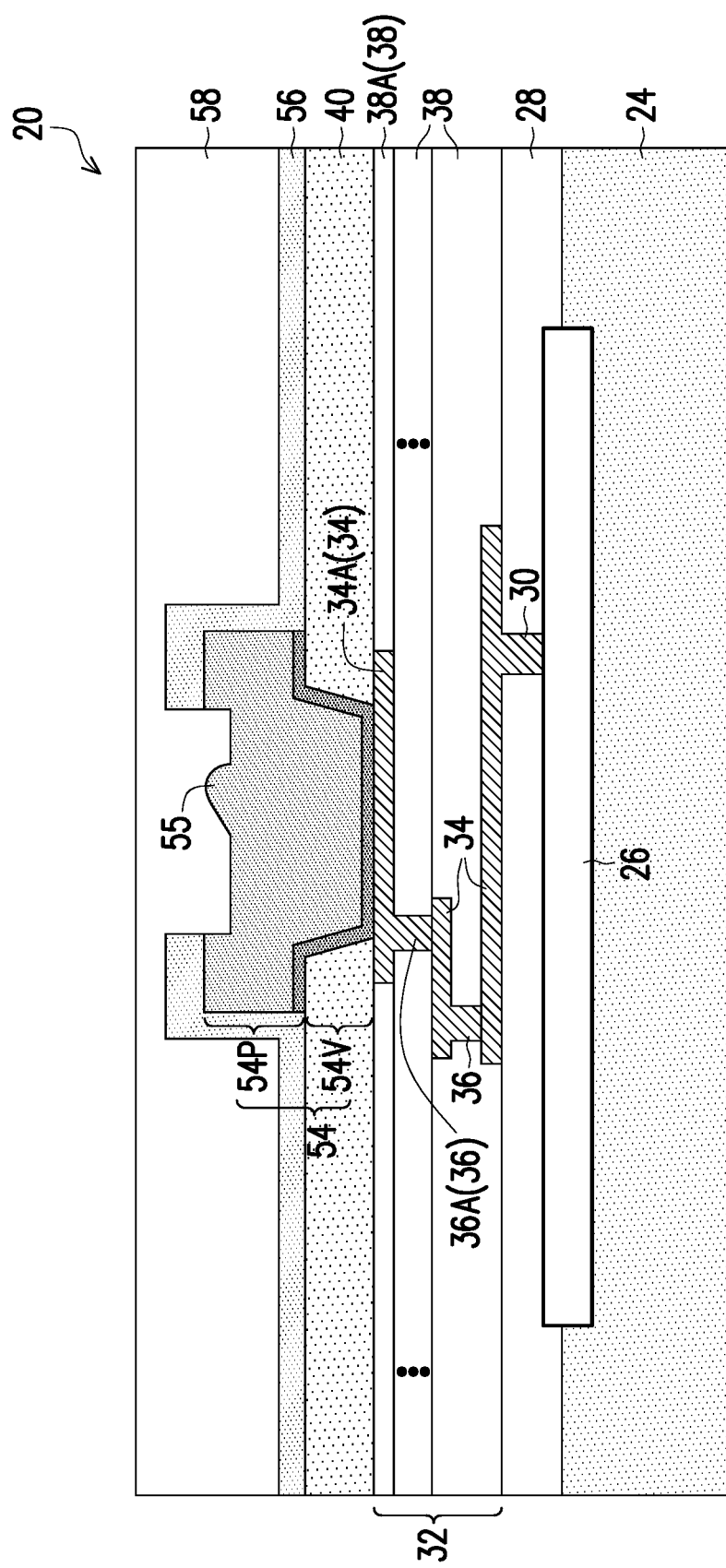
Figure 29:
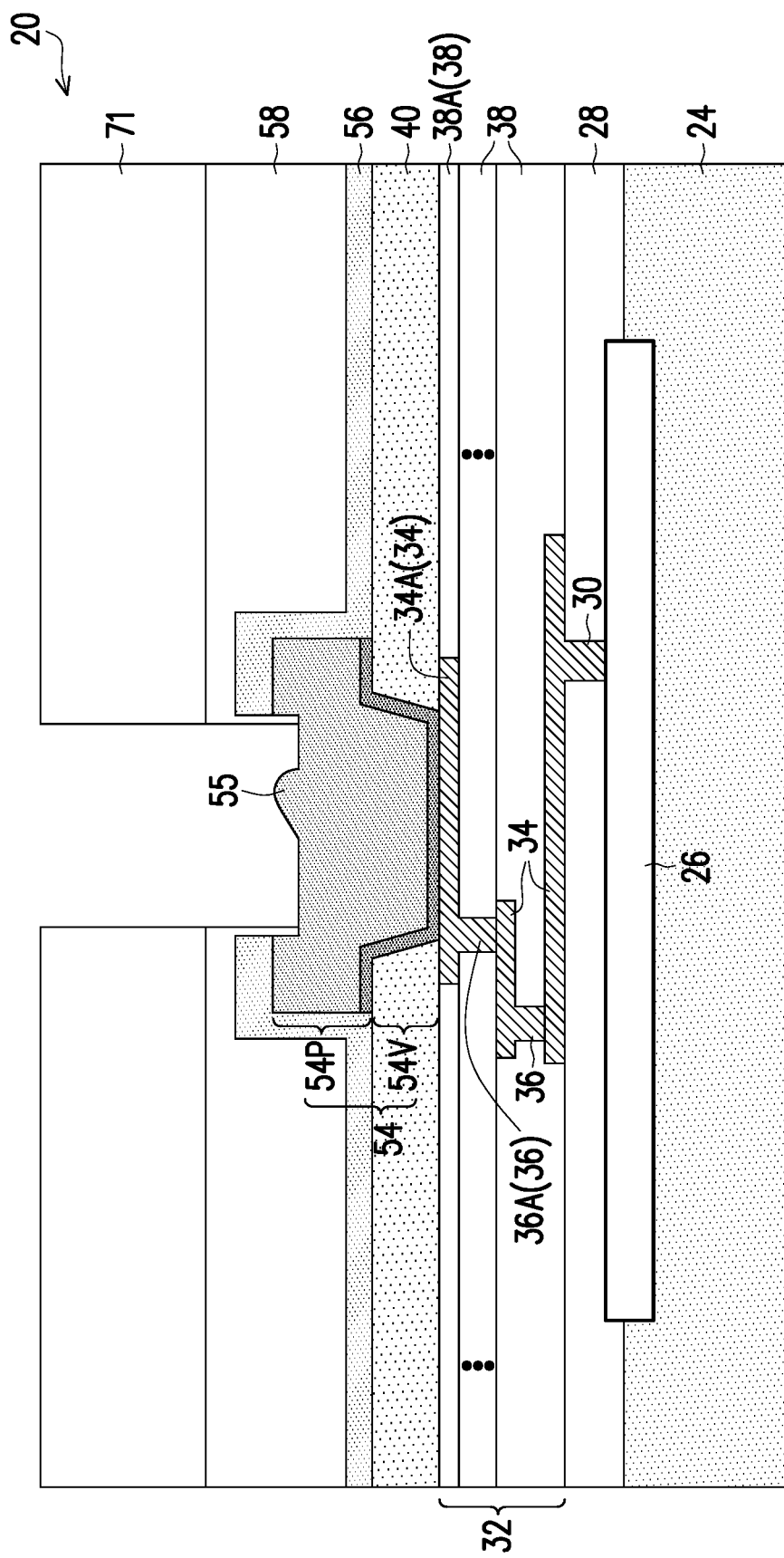

A planarization process is then performed to level the top surfaces of planarization layer 58, as shown in FIG. 28. Differing from the embodiment as shown in FIG. 23, the planarization process stops above the top surfaces of passivation layer 56, so that a layer of planarization layer 58 is left to be directly over passivation layer 56. Next, referring to FIG. 29, an etching mask 71 is formed and patterned, and is used to remove a first portion of planarization layer 58 directly over metal pad 54P, while leaving second portions of planarization layer 58 directly over metal pad 54P unremoved. Etching mask 71 is then removed.

Figure 30:
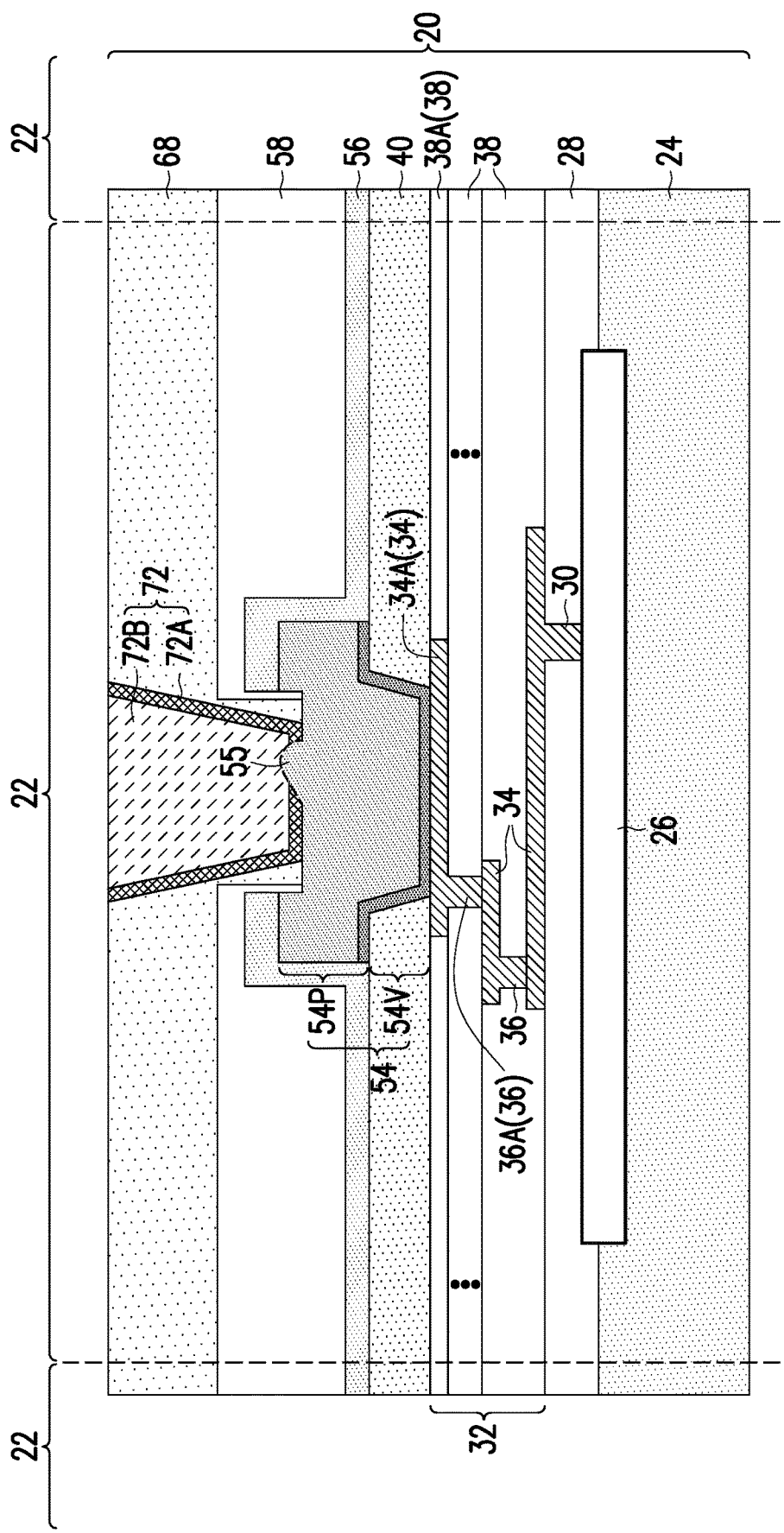

Referring to FIG. 30, polymer layer 68 is applied. Since the top surface of planarization layer 58 is planar, the top surface of polymer layer 68 is more planar than if planarization layer 58 is not formed. Next, polymer layer 68 is patterned, for example, through a light-exposure process and a development process when polymer layer 68 is photo sensitive. Otherwise, when polymer layer 68 is not photo sensitive, polymer layer 68 is etched through a photo lithography process.

FIG. 30 also illustrates the bonding feature 72 in accordance with some embodiments. In accordance with alternative embodiments, bonding feature 72 may be a solder region, which is shown in FIG. 13B. In a subsequent process, wafer 20 is singulated into discrete devices 22. Device 22 may be bonded to another package component 76, which is shown in FIG. 14.

FIGS. 31 through 35 illustrate the process for forming planar passivation structures in accordance with some embodiments. These embodiments are similar to the embodiments shown in FIGS. 1-12, 13A, 13B, and 14, except the probing is performed before the formation of passivation layer 56, and passivation layer 56 is formed over, rather than under, planarization layer 58. Also, the isolation layer 60 as shown in FIG. 14 is not formed.

Figure 31:
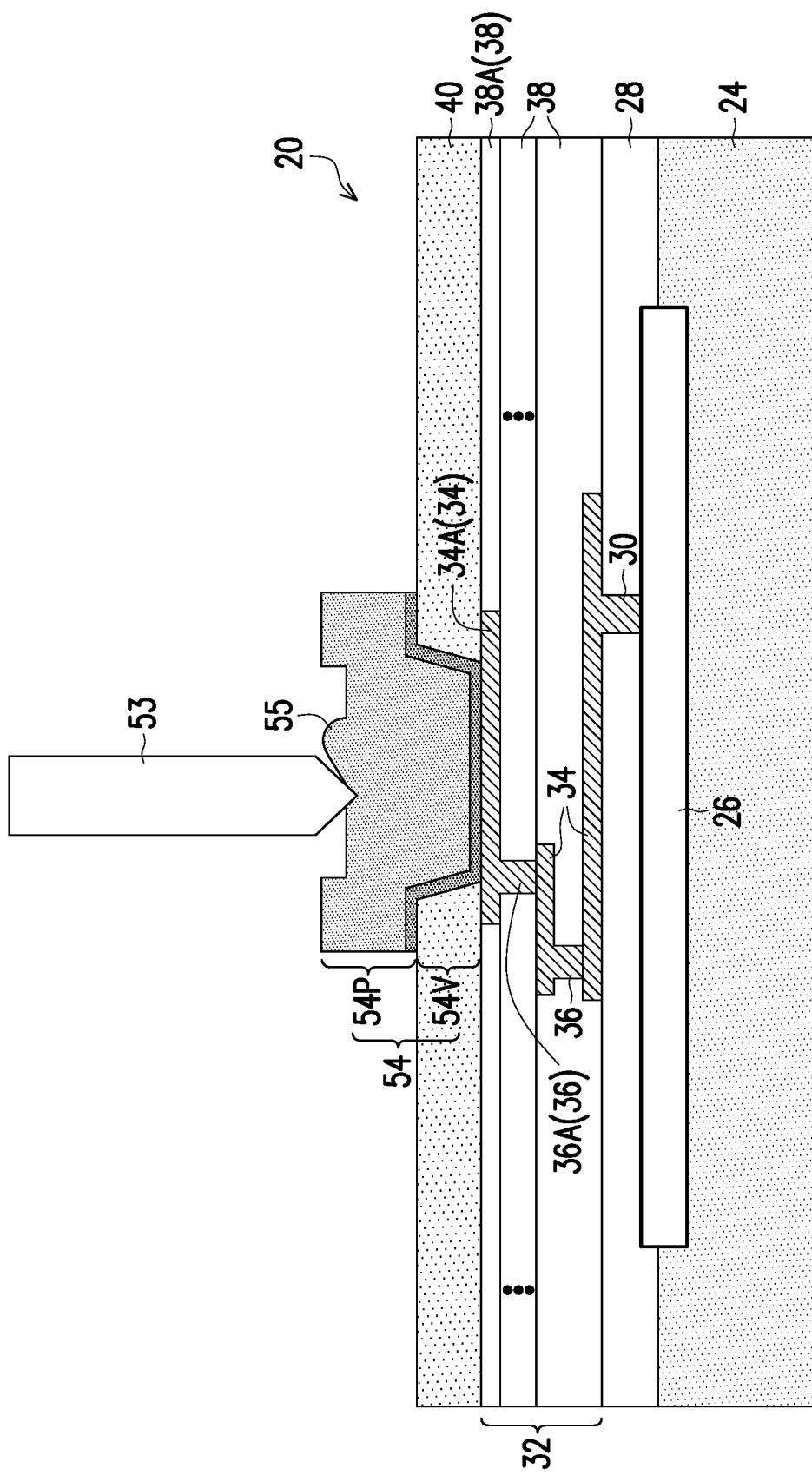
FIGS. 31 through 35 illustrate the cross-sectional views of intermediate stages in the formation of a package component in accordance with some embodiments.

The initial processes of these embodiments are the same as shown in FIGS. 1-7. Next, as shown in FIG. 31, a probing process is performed using probe pin 53, which process is the same as the probing process as shown in FIG. 9, and the details are not repeated herein. Probe mark 55 may be generated. Next, referring to FIG. 32, planarization layer 58 is deposited. Planarization layer 58 may be formed of or may comprise SiO$_2$, while other dielectric materials such as SiOC, SiON, or the like, may be used. Planarization layer 58 may also be formed of a material having isolation ability to detrimental substances such as moisture, and the material may include SiN, SiCN, or the like. Accordingly, planarization layer 58 integrates the functions of both of the planarization layer and the isolation layer. Planarization layer 58 is formed either through a conformal deposition process such as CVD, ALD, or the like, or a non-conformal deposition process such as PECVD, HDPCVD, spin-coating, Flowable Chemical Vapor deposition (FCVD), or the like.

Figure 32:
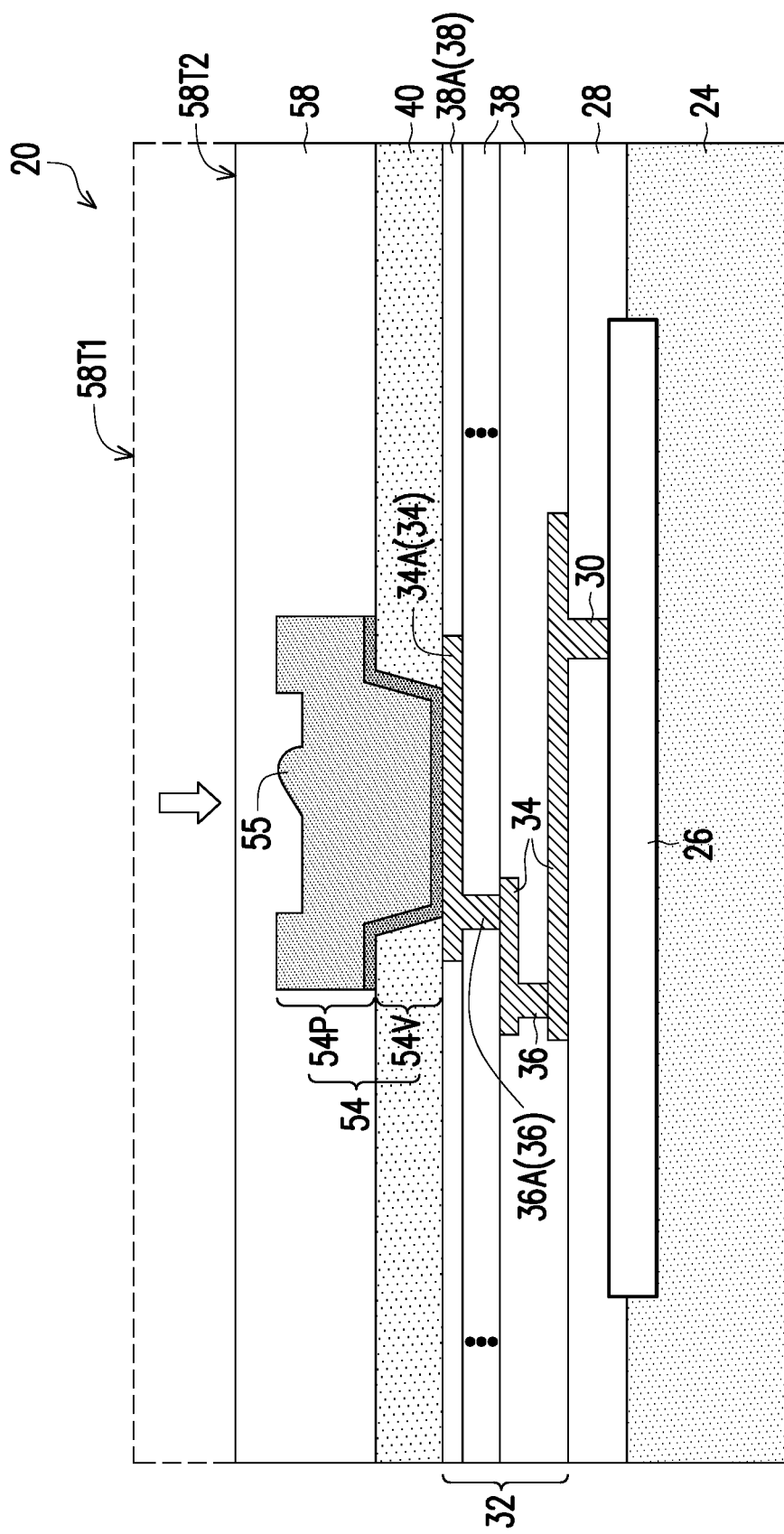

A planarization process is then performed to level the top surfaces of planarization layer 58, as shown in FIG. 32. Due to the planarization process, the top surface of planarization layer 58 comprises scratching marks, which are the parallel shallow grooves caused by the scratching of slurry on planarization layer 58. This may be used to identify whether a planarization process is performed or not. The dashed top surfaces 58T1 and 58T2 represent the top surfaces of planarization layer 58 before and after, respectively, the planarization process. The planarization process stops above the top surfaces of metal pad 54P, so that a layer of planarization layer 58 layer 58 is left to be directly over metal pad 54P.

Figure 33:
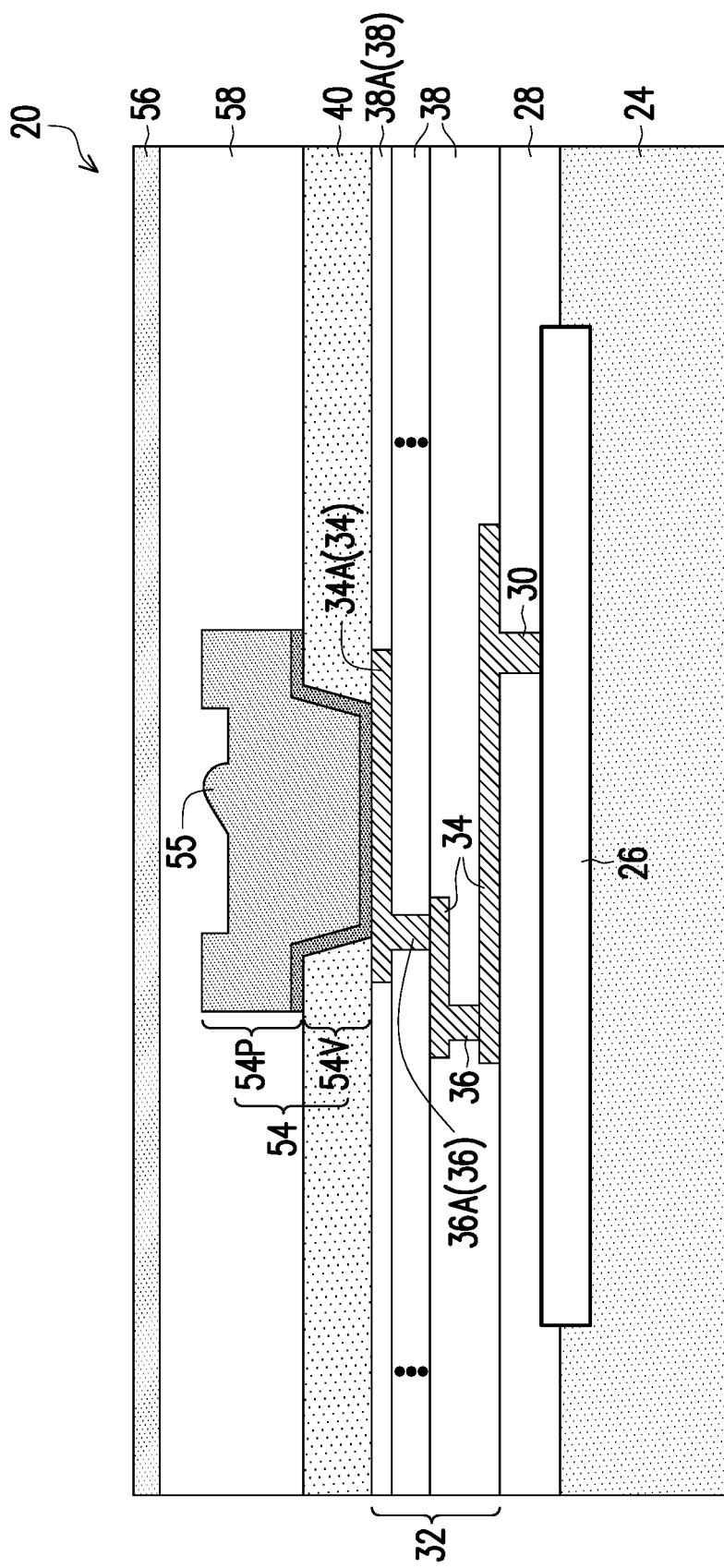

Next, as shown in FIG. 33, passivation layer 56 is deposited through a conformal deposition process, while a non-conformal deposition process may also be adopted. Since the top surface of ulayer 58 layer 58 is planar, the top surface of passivation layer 56 is planar.

Figure 34:
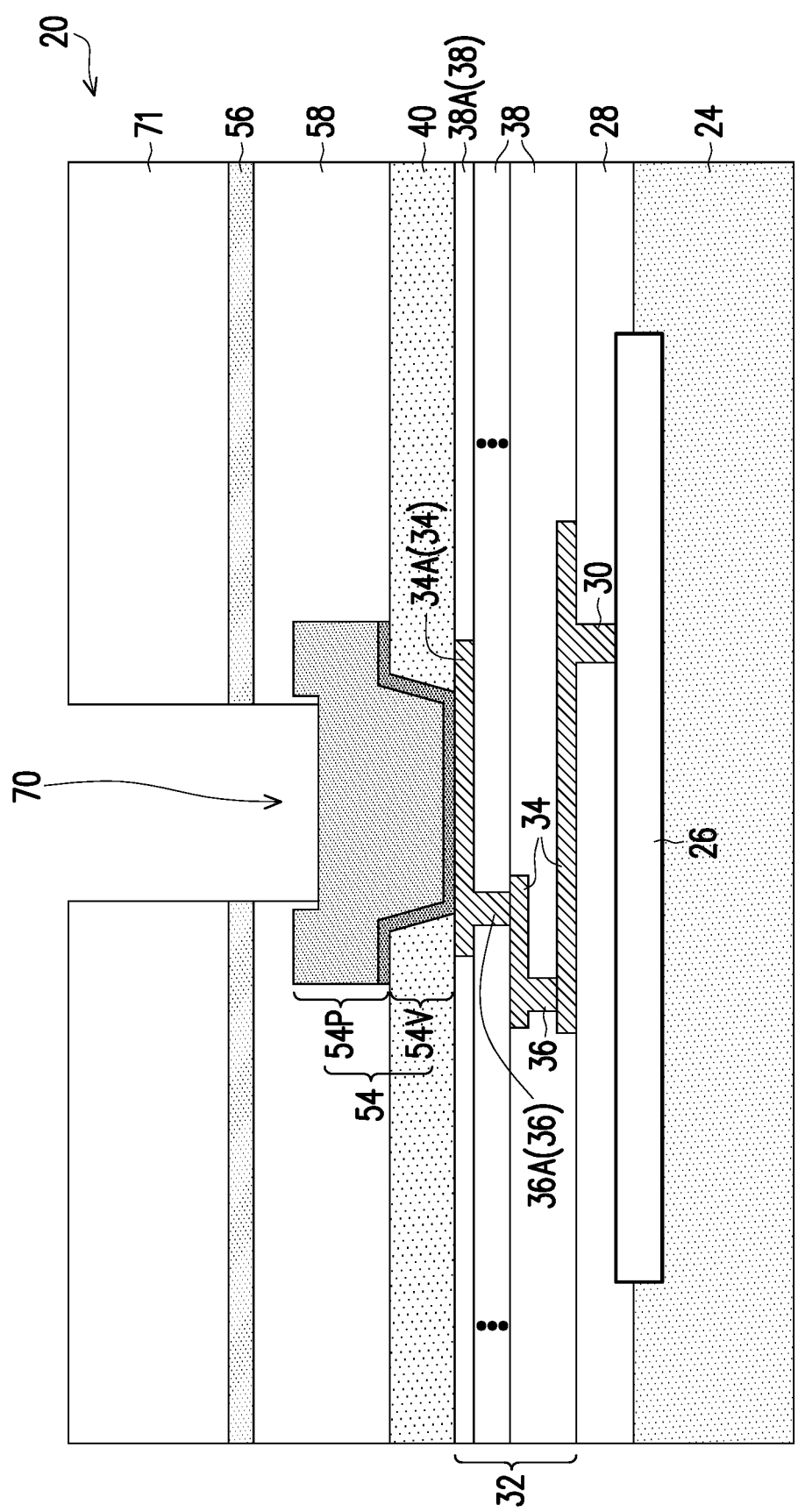

Referring to FIG. 34, etching mask 71 is formed and patterned, and is used to remove first portions of passivation layer 56 and planarization layer 58 directly over metal pad 54P, while leaving second portions of passivation layer 56 and planarization layer 58 directly over metal pad 54P unremoved. Etching mask 71 is then removed.

Figure 35:
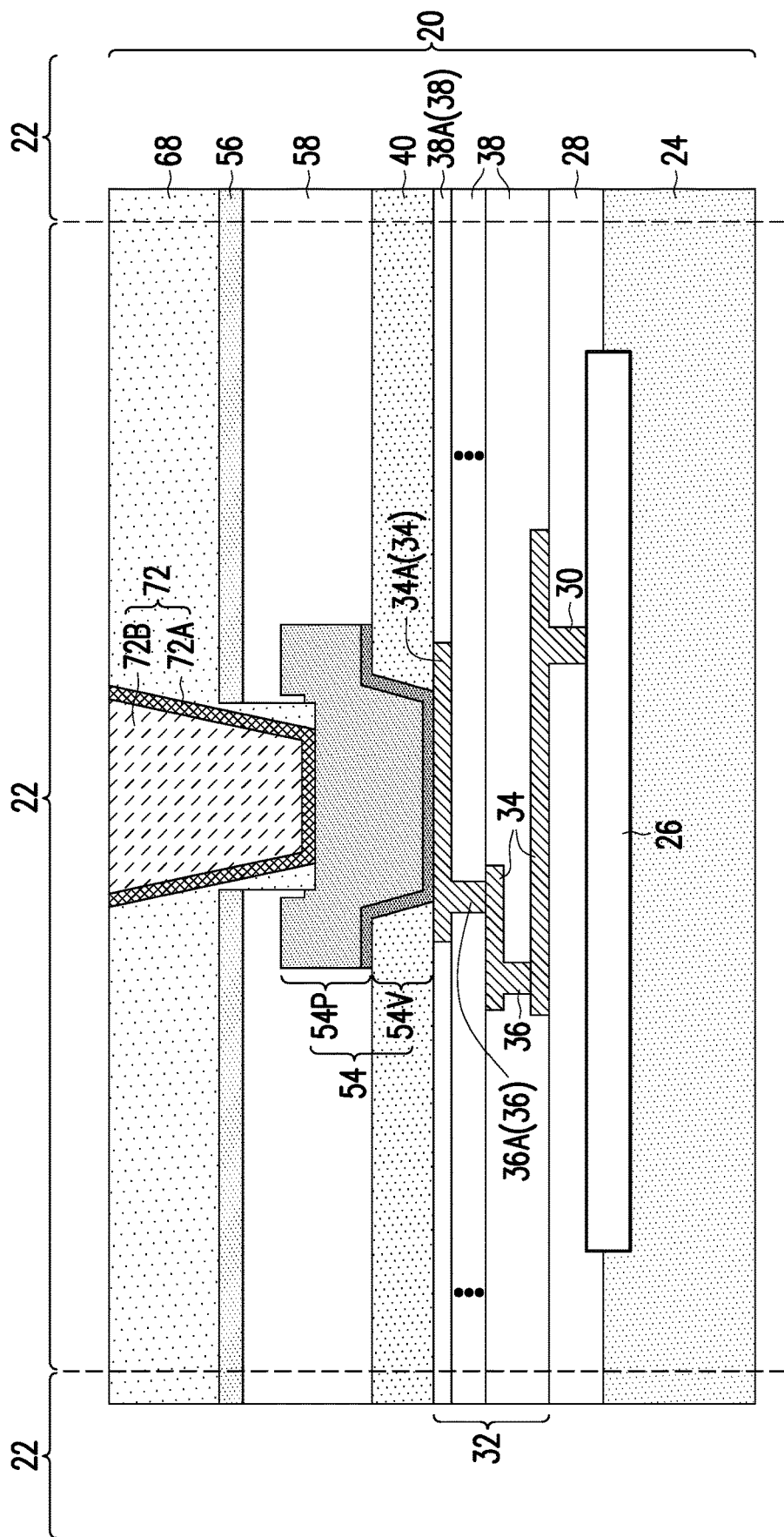

Referring to FIG. 35, polymer layer 68 is applied. Since the top surface of passivation layer 56 is planar, the top surface of polymer layer 68 is planar. Next, polymer layer 68 is patterned, for example, through a light-exposure process and a development process when polymer layer 68 is photo sensitive. Otherwise, when polymer layer 68 is not photo sensitive, polymer layer 68 is etched through a photo lithography process.

FIG. 35 also illustrates the bonding feature 72 in accordance with some embodiments. In accordance with alternative embodiments, bonding feature 72 may be a solder region, which is shown in FIG. 13B. In a subsequent process, wafer 20 is singulated into discrete devices 22. Device 22 may be bonded to another package component 76, which is shown in FIG. 14.

Figure 36:
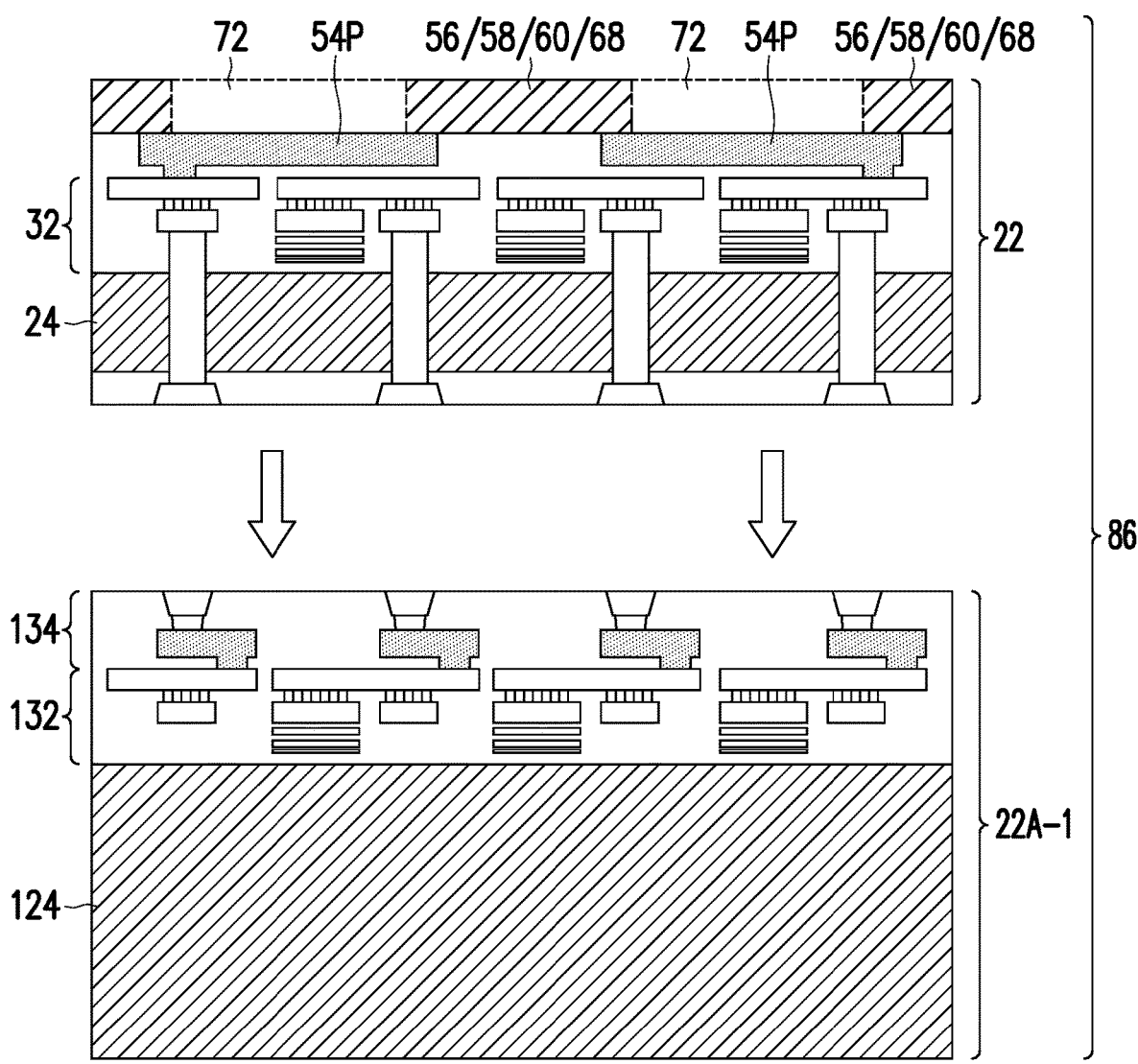
FIG. 36 illustrates a face-to-back bonding of two package components in accordance with some embodiments.
Figure 37:
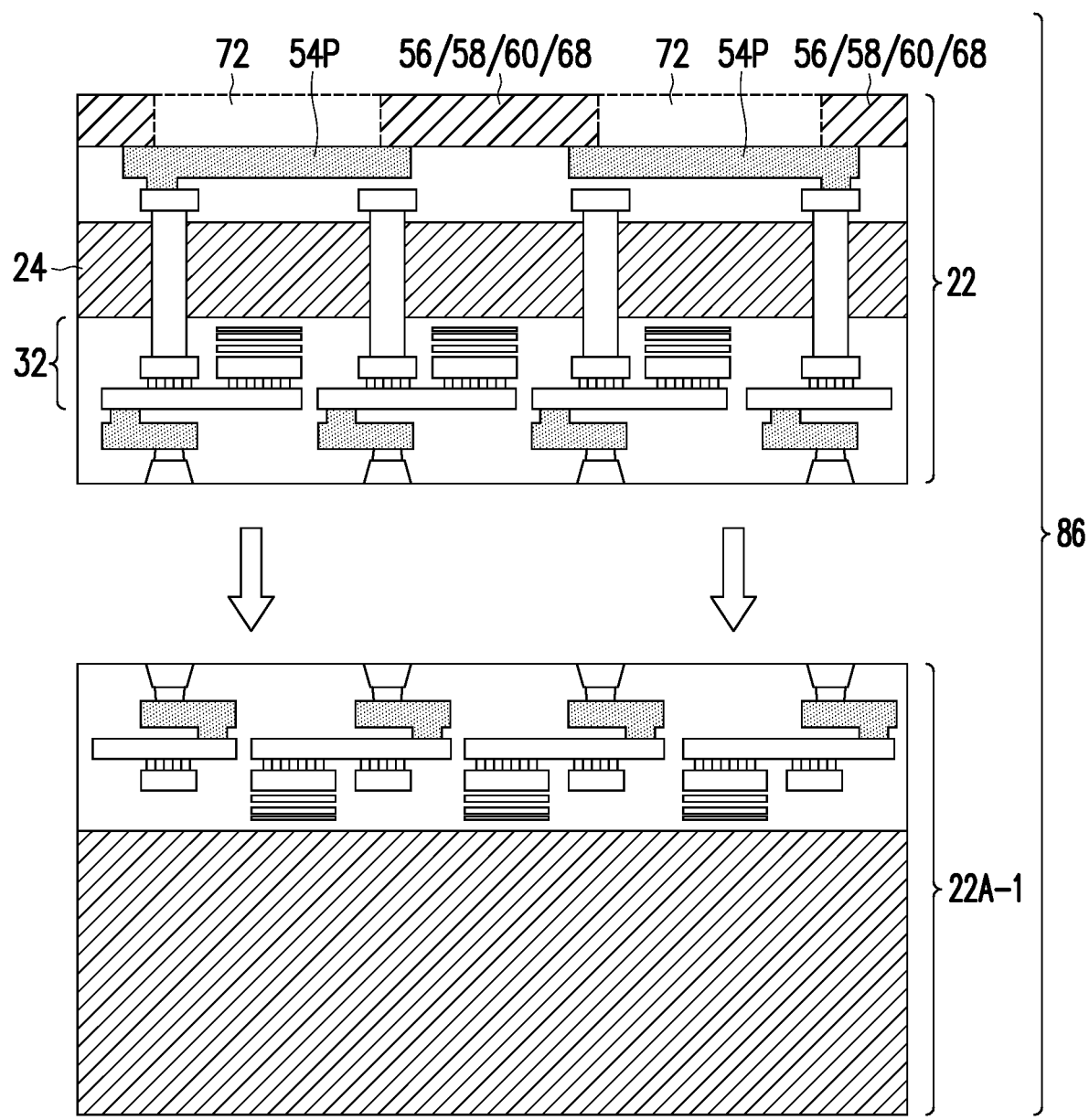
FIG. 37 illustrates a face-to-face bonding of two package components in accordance with some embodiments.

FIGS. 36 and 37 illustrate the bonding of device 22 (as formed in preceding embodiments) to another device 22A-1 to form package 86. In accordance with some embodiments, device 22A-1 is a device die, which may include semiconductor substrate 124, interconnect structure 132, and bonding structures 134 over semiconductor substrate 124. In FIG. 36, the front side of device 22 faces up, with active devices (not shown in FIG. 36, refer to integrated circuit devices 26 in FIG. 1) being formed at the top surface of semiconductor substrate 24. Dielectric layers 56/58/60/68 as presented in preceding embodiments are shown schematically, and metal pads 54P and bonding features 72 as presented in preceding embodiments are also shown schematically. In the embodiments in FIG. 36, dielectric layers 56/58/60/68, metal pads 54P, and bonding features 72 are formed on the front side of the device 22, and the bonding is face-to-back bonding. In the embodiments in FIG. 37, dielectric layers 56/58/60/68 and bonding features 72 are formed on the back side of the device 22, and the bonding is face-to-face bonding.

Figure 38:
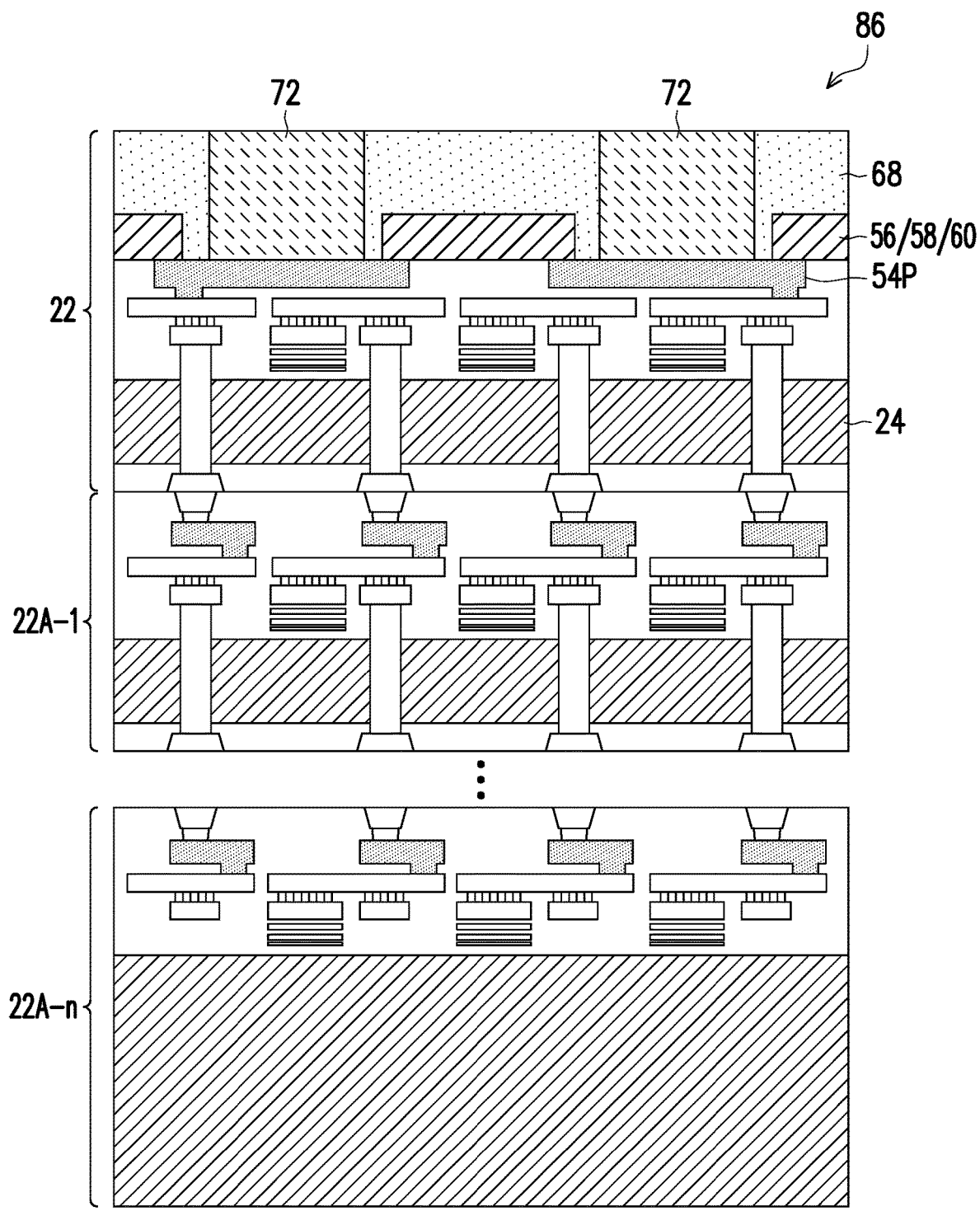
FIGS. 38 and 39 illustrate die stacks having passivation structures and bonding structures in accordance with some embodiments.

FIG. 38 illustrate the formation of a die stack 86 in accordance with some embodiments. Die stack 86 includes device 22 (as formed in preceding embodiments) bonded to devices 22A-1 through 22A-n, with integer n being greater than 1. In FIG. 38, the bonding feature 72 may include the structure as shown in FIG. 13A.

Figure 39:
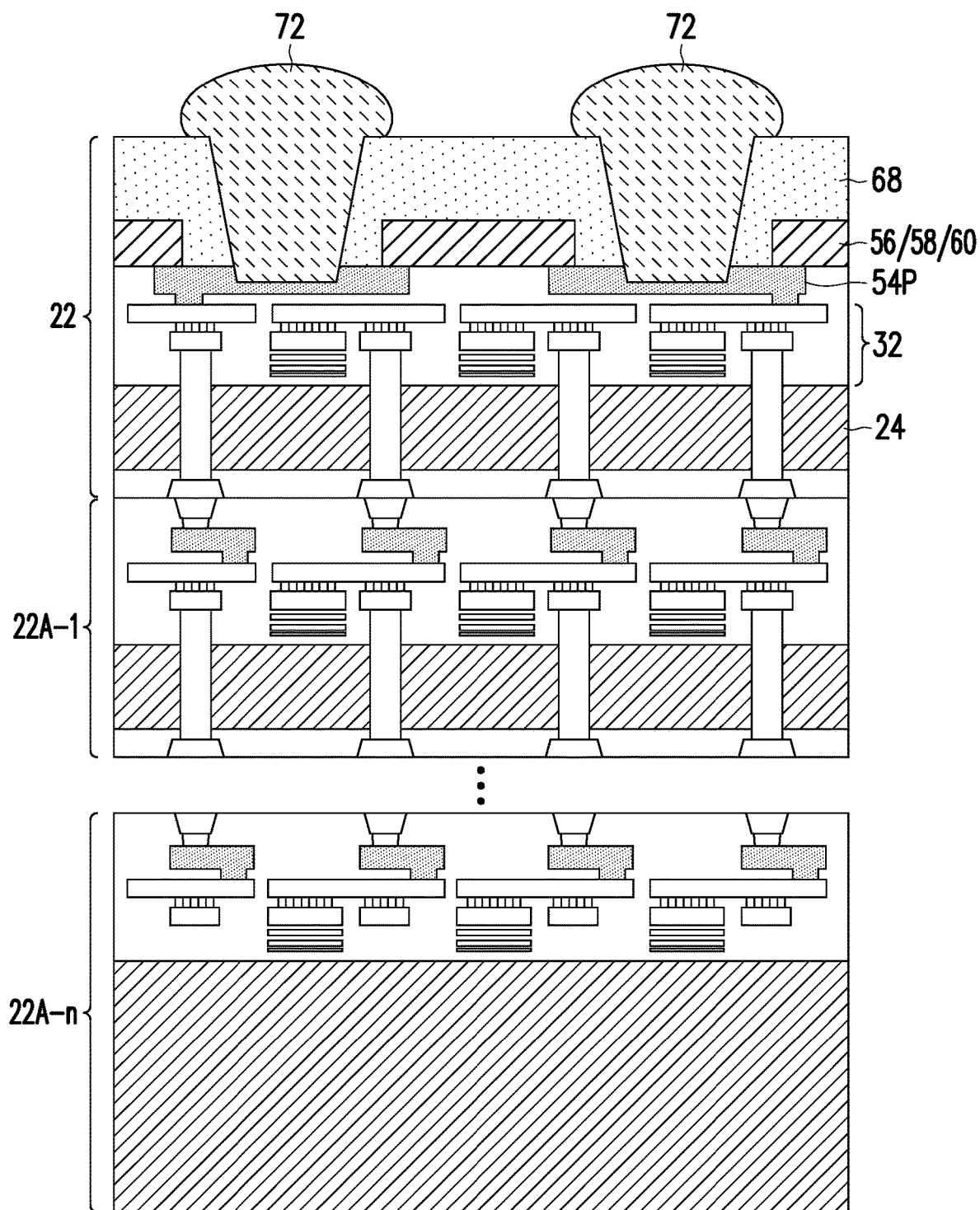

FIG. 39 illustrate the formation of package 86 (which includes a die stack) in accordance with some embodiments. Die stack 86 includes device 22 (as formed in preceding embodiments) bonded to devices 22A-1 through 22A-n. In FIG. 39, the bonding feature 72 may include the structure as shown in FIG. 13B.

Figure 40:
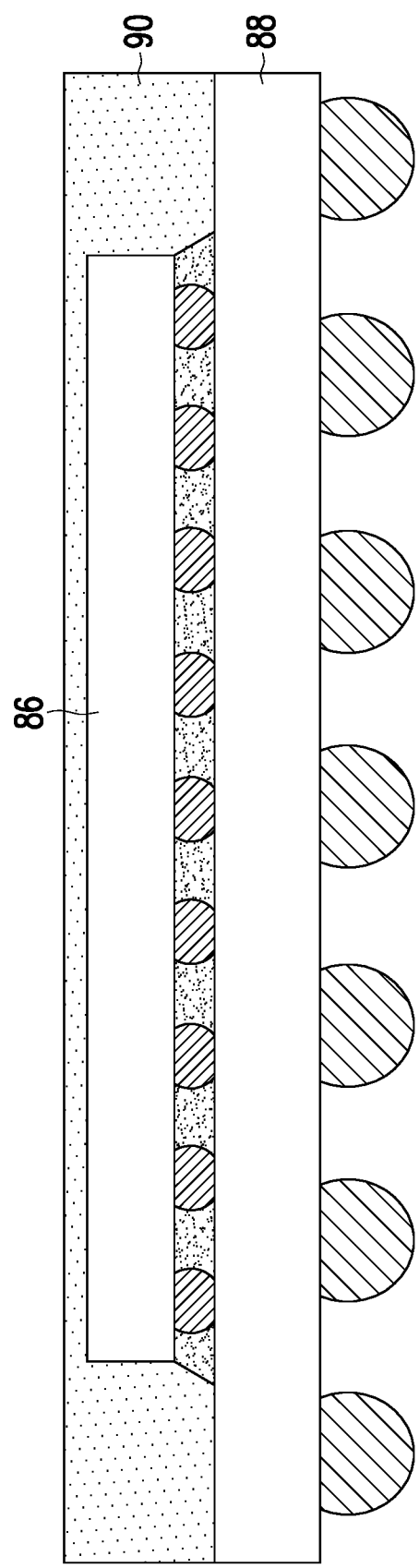
FIGS. 40, 41, and 42 illustrate the usage of the package components in accordance with some embodiments.
Figure 41:
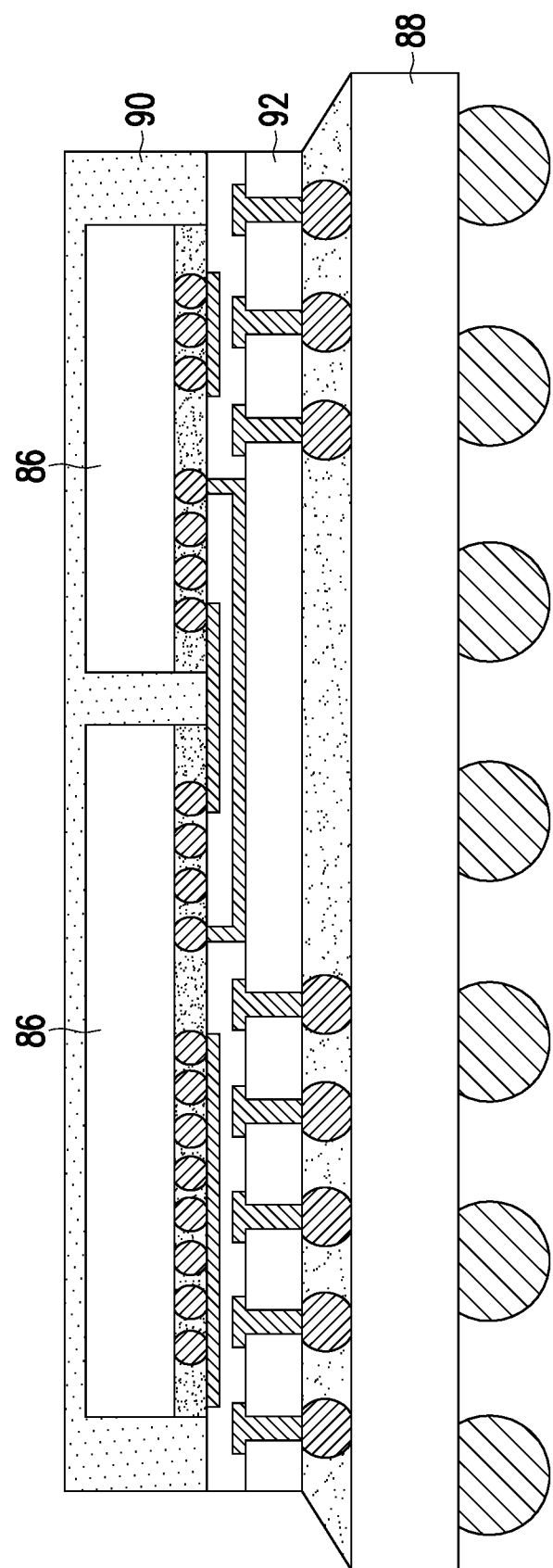
Figure 42:
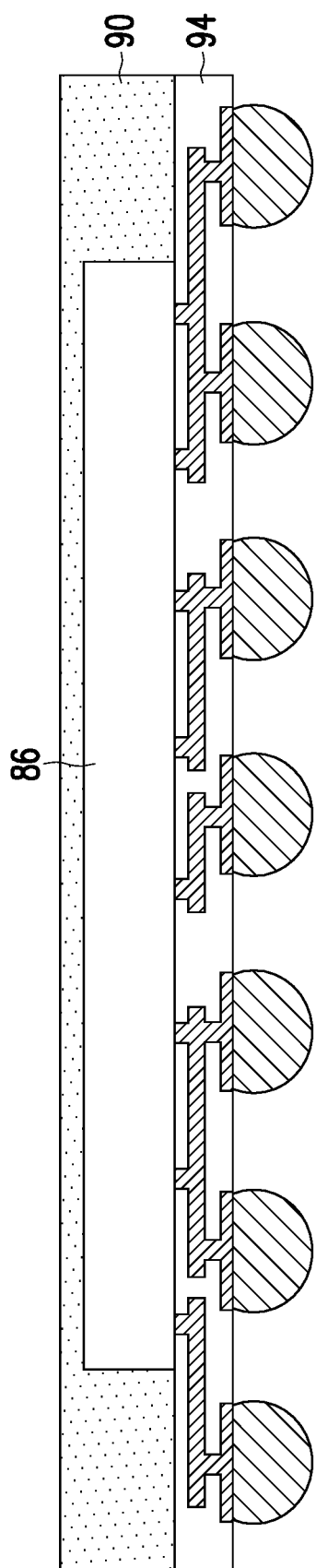

FIGS. 40, 41, and 42 illustrate the usage and the corresponding application of device 22 and the corresponding package 86 in accordance with some embodiments. In FIG. 40, package 86 (which include device 22 therein) is bonded to a package substrate 88, and is encapsulated in encapsulant 90, which may be a molding compound, a molding underfill, or the like. In FIG. 41, packages 86 (which include devices 22 therein) are bonded to interposer 92, which is further bonded to package substrate 88. Packages 86 are encapsulated in encapsulant 90, which may be a molding compound, a molding underfill, or the like. In FIG. 42, fan-out redistribution structure 94 is formed on package 86. The formation process may include encapsulating package 86 (which include device 22 therein) in encapsulant 90, planarizing the device 22 in package 86 and encapsulant 90 until the bonding features 72 (FIG. 13A) are revealed, and forming fan-out redistribution structure 94.

The embodiments of the present disclosure have some advantageous features. In conventional bonding structures, a polymer layer is formed on non-planar dielectric layers and metal pads. Since the viscosity of the used polymer is high, to make the top surface of the polymer layers to be planar in order to have a good wafer-to-wafer bonding, the polymer needs to be very thick. This affects the overall thickness of the resulting device dies. In accordance with some embodiments of the present disclosure, planar top surfaces are first formed for dielectric layer(s) before the corresponding polymer is applied. Accordingly, the top surface of the corresponding polymer may be planar without the need of increasing the thickness of the polymer layer.

In accordance with some embodiments of the present disclosure, a method comprises forming a first passivation layer; forming a metal pad over the first passivation layer; forming a planarization layer comprising a planar top surface over the metal pad; patterning the planarization layer to form a first opening, wherein a top surface of the metal pad is revealed through the first opening; forming a polymer layer extending into the first opening; and patterning the polymer layer to form a second opening, wherein the top surface of the metal pad is revealed through the second opening. In accordance with an embodiment, the structure further comprises depositing a second passivation layer on the metal pad, wherein the planarization layer is deposited over the second passivation layer; and performing a planarization process on the planarization layer. In accordance with an embodiment, the planarization process is stopped when a first top surface of the second passivation layer is revealed, and when a second top surface of the second passivation layer is under the planarization layer. In accordance with an embodiment, the first top surface overlaps the metal pad. In accordance with an embodiment, the planarization process is stopped when an entirety of the second passivation layer is under the planarization layer. In accordance with an embodiment, the method further comprises depositing a second passivation layer on the metal pad, wherein the planarization layer is deposited over the second passivation layer, and the planarization layer is deposited as having the planar top surface and a non-planar bottom surface. In accordance with an embodiment, no planarization process is performed between the planarization layer is deposited and the polymer layer is dispensed. In accordance with an embodiment, the method further comprises, after the forming the metal pad and before the forming the planarization layer, probing the metal pad. In accordance with an embodiment, each of the first passivation layer and the planarization layer is an inorganic layer.

In accordance with some embodiments of the present disclosure, a structure comprises a first passivation layer; a metal pad over the first passivation layer; a planarization layer with at least a portion over the metal pad, wherein the planarization layer comprises a planar top surface, and a non-planar bottom surface; a second passivation layer over the metal pad and the first passivation layer; and a polymer layer comprising an upper portion over the planarization layer and the second passivation layer, wherein the polymer layer extends into an opening in the planarization layer and the second passivation layer to contact the metal pad. In accordance with an embodiment, the planarization layer is over the second passivation layer. In accordance with an embodiment, the structure further comprises a conformal dielectric layer over the planarization layer, wherein the conformal dielectric layer and the planarization layer are formed of different materials. In accordance with an embodiment, the planarization layer comprises a first top surface, and the second passivation layer comprises a second top surface coplanar with the first top surface, and wherein a first portion of the second top surface overlaps the metal pad. In accordance with an embodiment, a second portion of the second top surface is vertically offset from the metal pad. In accordance with an embodiment, an entirety of the second passivation layer is under the planarization layer. In accordance with an embodiment, the planarization layer is underlying the second passivation layer, and is in contact with the metal pad. In accordance with an embodiment, the planarization layer comprises a first edge facing the opening, and the second passivation layer comprises a second edge facing the opening, and wherein the first edge and the second edge are vertically aligned to each other.

In accordance with some embodiments of the present disclosure, a structure comprises a first passivation layer; a conductive feature comprising a conductive via extending into the first passivation layer, and a conductive pad over the first passivation layer; a second passivation layer comprising a first portion over and in contact with the first passivation layer, and a second portion over and in contact with the conductive pad, wherein the second portion comprises a first top surface; a planarization layer over and in contact with the first portion of the second passivation layer, wherein the planarization layer comprises a second top surface coplanar with the first top surface; and a polymer layer comprising a portion over and contacting the conductive pad. In accordance with an embodiment, an entirety of the planarization layer is vertically offset from the conductive pad. In accordance with an embodiment, the polymer layer is in contact with both of the first top surface and the second top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a metal pad;
   a passivation layer, with a portion of the passivation layer overlapping a part of the metal pad;
   a planarization layer comprising a planar top surface, wherein the planar top surface comprises:
   a first part overlapping the metal pad; and
   a second part vertically offset from the metal pad;
   a polymer layer comprising:
   a first portion overlapping the planarization layer; and
   a second portion extending into the planarization layer and the passivation layer to contact the metal pad; and
   a conductive feature in the polymer layer to contact the metal pad.

2. The structure of claim 1, wherein both of the passivation layer and the planarization layer comprise inorganic dielectric materials.

3. The structure of claim 1, wherein the planarization layer forms a non-planar bottom interface with the passivation layer.

4. The structure of claim 1, wherein the passivation layer comprises a first edge overlapping the metal pad, and the planarization layer comprises a second edge overlapping the metal pad, and wherein the second edge is continuously joined to the first edge.

5. The structure of claim 4, wherein the polymer layer contacts both of the first edge and the second edge.

6. The structure of claim 4, wherein the second edge is vertically aligned to the first edge.

7. The structure of claim 1, wherein the conductive feature comprises:
- a conductive adhesion layer; and
- a conductive region on the conductive adhesion layer.

8. The structure of claim 1, wherein the conductive feature comprises a solder region.

9. The structure of claim 1, wherein the passivation layer further comprises an additional portion vertically offset from the metal pad.

10. The structure of claim 1 further comprising an additional passivation underlying and contacting the passivation layer.

11. The structure of claim 1, wherein the metal pad comprises a bump protruding higher than remaining portions of the metal pad, wherein the bump is in contact with the conductive feature.

12. A structure comprising:
- a metal pad;
- a first passivation layer on a sidewall and a top surface of the metal pad, wherein the first passivation layer comprises a first edge;
- a planarization layer over the first passivation layer, wherein the planarization layer comprises a second edge continuously joined to the first edge; and
- a polymer layer comprising:
  - an upper portion over the planarization layer; and
  - a lower portion in the planarization layer and the first passivation layer to contact the metal pad, wherein the lower portion contacts both of the first edge and the second edge.

13. The structure of claim 12, wherein both of the first edge and the second edge are vertical.

14. The structure of claim 12, wherein the second edge is vertically aligned to the first edge.

15. The structure of claim 12 further comprising a conductive feature in the polymer layer, wherein the conductive feature overlaps and contacts the metal pad.

16. The structure of claim 15, wherein top surfaces of the conductive feature and the polymer layer are coplanar.

17. The structure of claim 12, wherein the metal pad comprises a center portion comprising a first top surface, and an edge portion comprising a second top surface, and wherein the second top surface is higher than the first top surface.

18. A structure comprising:
- a first passivation layer;
- a conductive feature comprising a conductive via extending into the first passivation layer, and a conductive pad over the first passivation layer;
- a second passivation layer comprising a portion over the conductive feature;
- a planarization layer over the second passivation layer; and
- a polymer layer comprising a portion over and contacting the conductive pad, wherein the polymer layer contacts both of the second passivation layer and the planarization layer.

19. The structure of claim 18, wherein the polymer layer contacts top surfaces of both of the second passivation layer and the planarization layer.

20. The structure of claim 18, wherein the polymer layer contacts edges of both of the second passivation layer and the planarization layer.

* * * * *